US012706130B2

(12) United States Patent
Lue

(10) Patent No.: US 12,706,130 B2
(45) Date of Patent: Aug. 11, 2026

(54) CONTENT ADDRESSABLE MEMORY FOR LARGE SEARCH WORDS

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 108 days.

(21) Appl. No.: 18/789,540

(22) Filed: Jul. 30, 2024

(65) Prior Publication Data

US 2024/0386923 A1 Nov. 21, 2024

Related U.S. Application Data

(63) Continuation of application No. 17/866,958, filed on Jul. 18, 2022, now Pat. No. 12,094,568.

(51) Int. Cl.
*G11C 16/04* (2006.01)
*G11C 7/10* (2006.01)
(Continued)

(52) U.S. Cl.
CPC .......... *G11C 7/1096* (2013.01); *G11C 7/1069* (2013.01); *G11C 7/12* (2013.01); *G11C 8/08* (2013.01); *G11C 15/04* (2013.01)

(58) Field of Classification Search
CPC ....... G11C 7/1096; G11C 7/1069; G11C 7/12; G11C 8/08; G11C 15/04; G11C 16/0483;
(Continued)

(56) References Cited

U.S. PATENT DOCUMENTS 8,169,808 B2 5/2012 Roohparvar
9,224,091 B2 12/2015 Arsovski
(Continued)

FOREIGN PATENT DOCUMENTS

JP 2018206451 A 12/2018
JP 2023044545 A 3/2023

OTHER PUBLICATIONS

Chang et al., "A 3T1R Nonvolatile TCAM Using MLC ReRAM for Frequent-Off Instant-On Filters in IoT and Big-Data Processing," in IEEE Journal of Solid-State Circuits, vol. 52, No. 6, Jun. 2017, pp. 1664-1679.
(Continued)

*Primary Examiner* — Huan Hoang
(74) *Attorney, Agent, or Firm* — Andrew L. Dunlap; Haynes Beffel & Wolfeld LLP

(57) ABSTRACT

A memory array is arranged to store data words in respective sets of TCAM cells, where each TCAM cell is configured to store ternary states of a bit of the stored word. A circuit to select a set of TCAM cells in the set of TCAM cells, such as decoders and drivers for word lines, bit lines, block select gates. A circuit to apply an input search word to the TCAM cells in the selected set of TCAM cells, such as a search word buffer or driver on one of word lines or bit lines for the array. A circuit to generate an output indicating similarity of the stored word in the selected set of TCAM cells to the input search word, based on mismatch or possible mismatch of more than one bit of the search word.

17 Claims, 17 Drawing Sheets

(51) Int. Cl.
*G11C 7/12* (2006.01)
*G11C 8/08* (2006.01)
*G11C 15/04* (2006.01)

(58) Field of Classification Search
CPC . G11C 15/046; G11C 11/4063; G06F 3/0604; G06F 3/0658; G06F 3/0659
USPC ........................................................ 365/49.17
See application file for complete search history.

(56) References Cited

U.S. PATENT DOCUMENTS

| | | | | |
|---|---|---|---|---|
| 9,524,980 | B2 | 12/2016 | Lue | |
| 9,698,156 | B2 | 7/2017 | Lue | |
| 10,629,264 | B2 | 4/2020 | Sawada et al. | |
| 10,741,585 | B2 | 8/2020 | Petti | |
| 10,777,566 | B2 | 9/2020 | Lue | |
| 11,100,994 | B2 | 8/2021 | Louie et al. | |
| 11,133,329 | B2 | 9/2021 | Lue | |
| 12,094,568 | B2* | 9/2024 | Lue | G11C 8/08 |
| 2004/0136217 | A1 | 7/2004 | de Sandre | |
| 2009/0190404 | A1 | 7/2009 | Roohparvar | |
| 2015/0003164 | A1* | 1/2015 | Roohparvar | G11C 16/08 365/185.17 |
| 2015/0332767 | A1 | 11/2015 | Arsovski | |
| 2017/0153835 | A1 | 6/2017 | Miki | |
| 2020/0192971 | A1 | 6/2020 | Lue et al. | |
| 2022/0108748 | A1 | 4/2022 | Tseng et al. | |
| 2022/0329503 | A1* | 10/2022 | Herber | H04L 45/20 |
| 2022/0351794 | A1* | 11/2022 | Graves | G11C 13/0007 |
| 2023/0090235 | A1 | 3/2023 | Kawasumi | |
| 2024/0021224 | A1 | 1/2024 | Lue | |

OTHER PUBLICATIONS

Cooke, "Flash memory 101: An introduction to NAND flash," edn.com/flash-memoryy-101-an-introduction-to-nand-flash, Mar. 20, 2006, 11 pages.

Lue et al., "3D AND: A 3D Stackable Flash Memory Architecture to Realize High-Density and Fast-Read 3D NOR Flash and Storage-Class Memory," 2020 IEEE International Electron Devices Meeting (IEDM), Dec. 12-18, 2020, 4 pages.

Lue et al., "Introduction of 3D AND-type Flash Memory and It¦s Applications to Computing-in-Memory (CIM)," 2021 International Symposium on VLSI Technology, Systems and Applications (VLSI-TSA), Apr. 19-22, 2021, pp. 1-2.

Lue et al., Write-In-Place Operation and It's Advantages to Upgrade the 3D AND-type Flash Memory Performances, 2021 IEEE International Memory Workshop (IMW), May 16-19, 2021, pp. 1-4.

* cited by examiner

SL(i)
SLT(1)
SLT(2)
SLT(3)
411
412
413
400
SB(1)
WL(1-1)
411
$\overline{SB(1)}$
WL(1-2)
401
SB(0)
WL(0-1)
412
$\overline{SB(0)}$
WL(0-2)
480
DATA WORD 0
DATA WORD 1
DATA WORD 2
421
422
423
BLT(1)
BLT(2)
BLT(3)
BL(i)

451
452
SENSE AMP (ADC)
x
COMPARATOR
450
THRESHOLD
453

CONTENT ADDRESSABLE MEMORY FOR LARGE SEARCH WORDS

PRIORITY APPLICATION

This application is a continuation of U.S. patent application Ser. No. 17/866,958 filed 18 Jul. 2022 (now U.S. Pat. No. 12,094,568); which application is incorporated herein by reference.

BACKGROUND

Field

Technology is described relating to ternary content addressable memory (TCAM), including TCAM comprising nonvolatile memory cells, TCAM suitable for similarity matching and TCAM suitable for large search words.

Description of Related Art

Systems providing efficient, high-throughput computing are being developed to support technologies such as artificial intelligence and machine learning. In an example system, a very large data set may be stored in nonvolatile memory, such as 3D NAND flash or 3D AND flash. To process the data set, it is moved in parts to a digital processing system, like DRAM and a GPU, where further computations are performed. However, the data set may be much larger than can be effectively handled by the digital system because, for this example, the DRAM may be much smaller than the nonvolatile memory. So, the data set is moved in steps to the digital system. The data movement however can require substantial amounts of time and consume large amounts of power, and thus becomes a limitation on the efficiency and throughput of the system.

It is desirable therefore to provide technology, including improved TCAM, that can improve the efficiency of data processing for very large data sets.

SUMMARY

A TCAM technology is described which is scalable to support very large search words. In one example system, a data set that includes a large number of stored words in nonvolatile memory can be accessed using search words. An output is generated providing an indication of a similarity of the stored words to the search words, rather than, or in addition to, an exact match. Similarity matching can be used for example to filter the data set, identifying stored words that are similar to a search word. Similarity matching has many uses. For example, the stored words identified as similar in this manner can then be transferred to a host system for further processing. This can substantially save on the data transfer costs associated with many techniques applied in artificial intelligence and machine learning.

A TCAM system described herein comprises a memory array arranged to hold stored words in respective sets of TCAM cells, where each TCAM cell is configured to store ternary states of a bit of the stored word. The system includes a circuit to select a set of TCAM cells in the set of TCAM cells, such as decoders and drivers for word lines, bit lines, block select gates and so on used in memory arrays. The system includes a circuit to apply an input search word to the TCAM cells in the selected set of TCAM cells, such as a search word buffer or driver on one of word lines or bit lines for the array. The system includes a circuit to generate an output indicating similarity of the stored word in the selected set of TCAM cells to the input search word, based on mismatch or possible mismatch of more than one bit of the search word.

Examples of a memory array suitable for use in the TCAM system include 3D NAND architecture arrays, 3D AND architecture arrays, and 3D NOR architecture arrays. The memory array can comprise a plurality of memory cells, and each TCAM cell in the sets of TCAM cells can include first and second memory cells in the array arranged to store ternary states of a bit of the stored word.

The array of memory cells can include bit lines coupled to respective columns of memory cells in the array, and word lines coupled to respective rows of memory cells in the array. The columns of memory cells in the array can be disposed on respective NAND strings arranged in columns, where each column of NAND strings in a given block shares a single bit line. First and second memory cells in the TCAM cells in one of the sets of TCAM cells can be disposed in one of the rows of memory cells and on two of the columns of memory cells. The circuit to select a set of TCAM cells can apply signals to the word lines, such as read voltage signals. The circuit to apply the input search word can apply the bits of the search word to the bit lines. The circuit to generate an output indicating similarity in this system combines the outputs of the plurality of pairs of first and second columns of memory cells. In a NAND architecture the outputs are currents carried on NAND strings in the first and second columns for each TCAM cell. The number of TCAM cells that comprise memory cells on the plurality of pairs of columns can be very large, as discussed in more detail below, to support very large search words.

In another example, the array of memory cells can comprise an array of stacks of memory cells, such as in a 3D AND architecture block or in a 3D NOR architecture block. In this example, a plurality of word lines in multiple levels is coupled to memory cells on respective rows of stacks of memory cells in the array, and first and second memory cells in the TCAM cells are disposed in first and second levels of one of the respective rows of stacks. In this arrangement, the circuit to select a set of TCAM cells can apply signals to the bit lines. The circuit to apply an input search word can apply signals to the word lines. The circuit to generate an output indicating similarity can combine outputs of the columns of stacks of memory cells of a plurality of TCAM cells in the selected set of TCAM cells.

A circuit to detect similarity in TCAM systems as described herein can generate a signal indicating similarity when a number of mismatches of bits in the stored word in the selected set of TCAM cells to the input search word is below a threshold, where the threshold is greater than one. Utilizing a threshold of one, can be used to indicate an exact match.

An example of a circuit to detect similarity can comprise a digital-to-analog converter, which generates a digital output which indicates a number of mismatch cells, which can be summed to indicate a similarity of the stored word to the search word. This number of mismatch cells can be compared to a threshold to identify stored words similar to the search word.

In another example, the TCAM system can include a circuit to replace one or more bits of an input search word with a "don't care" state, in effect establishing some bits of the input search word as wildcards. The circuit to generate an output indicating similarity can generate a signal indicating similarity when a mismatch of at least one bit in the stored word not masked by the don't care state in the search word, is detected. In the wildcard approach, the output of the sense amplifiers can be set to detect a single bit mismatch of unmasked bits of the search word, and thereby indicates a possibility of a multiple bit mismatch, because it is not detected whether there are mismatches in the masked bits. However, the signal is considered to indicate similarity in the context of this description.

Generally, a technology is based on storing a data set in a nonvolatile memory, and configuring the nonvolatile memory for TCAM operations. A TCAM similarity match is executed by applying search words to the nonvolatile memory in a manner which generates current, or other signals, for each TCAM cell which mismatches its corresponding bit of the search word. An output indicating similarity can be generated by combining the outputs of all the TCAM cells accessed by the search word, and indicating mismatch for the stored word when a threshold number of outputs of the TCAM cells indicates a mismatch. Also, an output indicating similarity can be generated by applying wildcard bits in the input search word, and indicating a mismatch for the stored word when at least one of the outputs of the TCAM cells indicating mismatch in the unmasked bits. The output indicating similarity can be an analog signal, based on sensing combined currents from mismatched cells in a single access cycle. The analog signal can be converted using analog to digital converter in some embodiments for digital signal processing.

In addition, techniques are described supporting very large search words which can include a plurality of partial search words. The circuit to indicate a similarity of the search word to the stored words can include logic to accumulate similarity match results of a plurality of partial search words using a time domain execution. This logic can be located near the sense amplifier circuitry and accumulate the results across the plurality of partial search words in memory.

Other aspects and advantages of the present technology can be seen on review of the drawings, the detailed description and the claims, which follow.

DETAILED DESCRIPTION

The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows.

Figure 1:
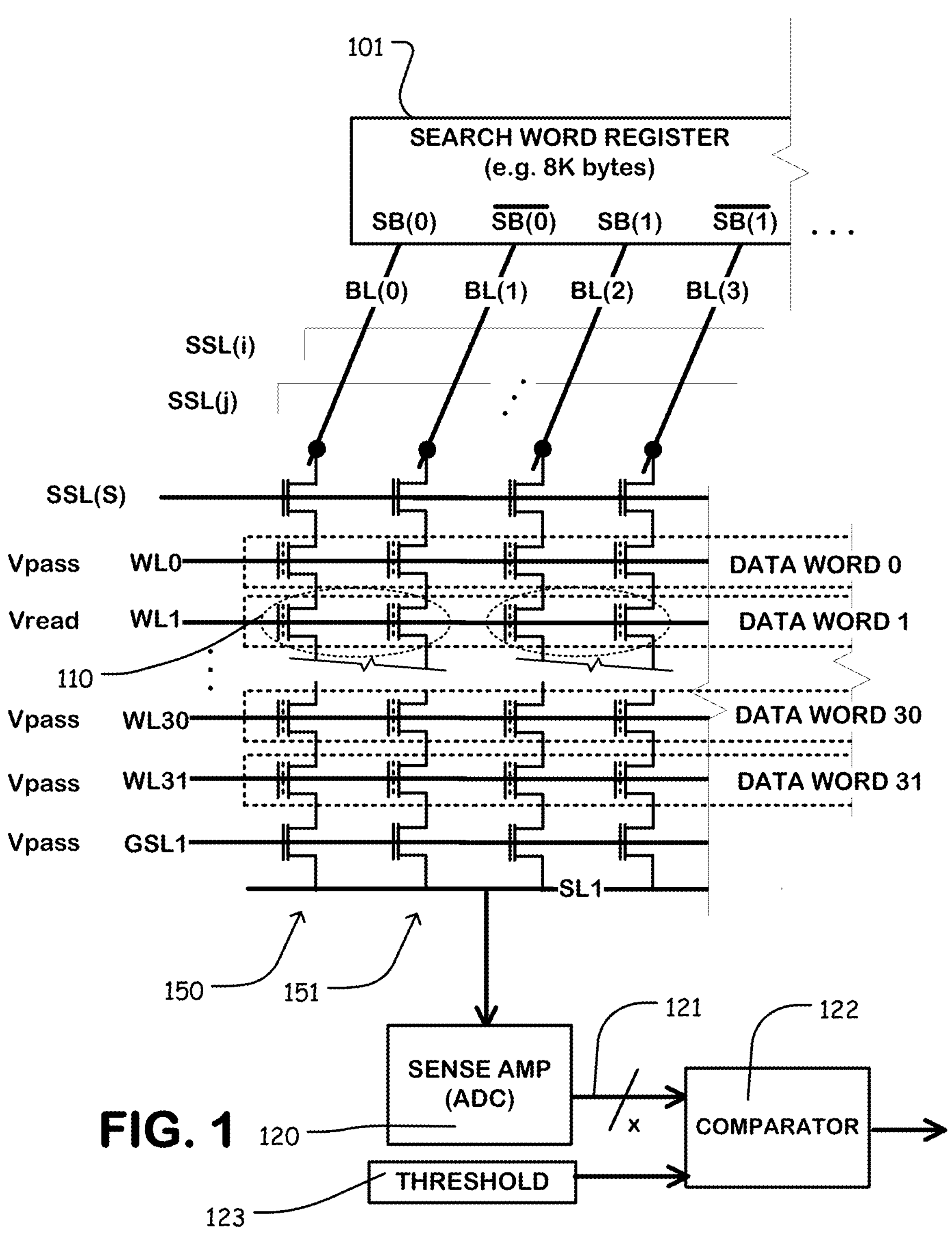
FIG. 1 is a simplified circuit diagram of a 3D nonvolatile NAND architecture memory configured as TCAM with similarity matching.

FIG. 1 is a schematic diagram of a NAND block including an array of vertical NAND strings arranged in rows and columns. A row in a NAND block for the purposes of this description is a set of NAND strings having a common string select line (e.g. SSL(S)), and common word lines (WL0 to WL31). Each NAND string in the row is coupled to different bit lines in response to the common string select line, so that they are logically arranged in a row along the common string select line and word lines.

A NAND block as described herein can be implemented using a 3D NAND memory technology. Some examples, among a variety of alternatives known in the art, of NAND blocks including vertical NAND stacks are described in U.S. Patent Application Publication No. US20200192971A1; which is incorporated by reference as if fully set forth herein. Implementations can also be made using 2D NAND technology, in which the NAND block is logically defined across the plurality of 2D NAND arrays.

The diagram shows one row of vertical NAND strings of a NAND block having string select line SSL(S). Multiple rows are included in a block on respective string select lines (SSL(i) and SSL(j)) shown schematically. For the purposes of this description a column of NAND string is a set of NAND strings having a common bit line, each NAND string in the column coupled to a different string select line, so that they are arranged logically in a column along the common bit line. In physical layout, a column or a row may be twisted, arranged in a honeycomb pattern or otherwise laid out for high density or for other reasons according to the manufacturing method applied.

In the diagram, a NAND string 150 and a NAND string 151 in a first row of the array are coupled to a first bit line BL(0) and second bit line BL(1) respectively, and to a shared source line SL1 for the row.

It is contemplated that a given NAND block can be coupled to many bit lines BL(i), for i going from 1 to B, including tens, hundreds or thousands of bit lines in a given implementation, along with corresponding numbers of columns of NAND strings in the array of NAND strings.

Each of the NAND strings in the block of NAND strings includes a string select switch coupled to a corresponding string select line (e.g. SSL(S)), which is used to connect and disconnect the corresponding NAND string to its bit line. It is contemplated that a given NAND block can be coupled to many string select lines, in a given implementation, along with corresponding numbers of rows of NAND strings in the array of NAND strings.

Each of the NAND strings in the array of NAND strings includes a ground select switch coupled to a ground select line GSL1 for the row, which is used to connect the corresponding NAND strings in the row of NAND strings to the source line SL1 for the row. In some embodiments, the shared source line may be connected to all the NAND strings in the block, or to portions of the NAND strings in the block other than a single row. In some embodiments, the ground select switches on corresponding NAND strings can be controlled by separate ground select lines.

Each of the NAND strings in the array of NAND strings includes a plurality of memory cells arranged in series between the string select switch and the ground select switch, coupled to corresponding word lines. In this example, each of word lines in a given level of the NAND block is coupled to separately controlled, single word line conductors, such that each row of memory cells in a given level can receive a different word line signal. In some embodiments, all the word lines or a set of word lines including more than one member, in a given level of a block are coupled to a single word line conductor, so all, or a selected plurality of, the rows of memory cells in a given level of the NAND block can receive the same word line signal. In this example, the NAND strings of the NAND block are vertical NAND strings including 32 levels of memory cells coupled to 32 word lines WL0-WL31. There can be different numbers of levels of word lines in different embodiments, including 100 or more levels in some technologies.

In a storage mode of operation, data can be written into the individual memory cells using program and erase operations supported by a page buffer (not shown) coupled to the plurality of bit lines of the block. In the storage mode operations, typically, one of the rows of NAND strings in the array of NAND strings is selected using a selected string select line. In this case, one of the NAND strings in each column of the array of NAND strings is coupled to one of the bit lines. A page buffer can be utilized to program a data pattern into the individual NAND strings in a selected row of the array of NAND strings coupled to a plurality of bit lines in parallel at each level of the NAND block. Also, the page buffer in the storage mode can be utilized to read data stored in the memory cells in a selected row of the array of NAND strings at each level of the NAND block.

In a storage mode, a large data set of data words can be stored into the NAND block. The NAND cells in the NAND block can be implemented using a single-bit-per-cell technology, or a multiple-bit-per-cell technology.

A system including the NAND block illustrated in FIG. 1 is an example circuit including an array of memory cells arranged to hold stored words (DATA WORD 0, DATA WORD 1, . . . DATA WORD 30, DATA WORD 31) in respective sets of TCAM cells, each TCAM cell in the sets of TCAM cells including first and second memory cells of the array to store ternary states of a bit of the respective stored words. In this example, a TCAM cell includes one memory cell in a first NAND string (e.g. NAND string 150) and a second memory cell in a second NAND string (e.g. NAND string 151). A data set that comprises a plurality of stored words, each stored word in this example being stored at one word line level along a row of NAND strings. Thus, in this example DATA WORD 0 is stored in the row selected by SSL(S) along word line WL0. DATA WORD 1 is stored in the row selected by SSL(S) along word line WL1, and so on through DATA WORD 31 stored in the row selected by SSL(S) along word line WL31.

Each bit in a stored word can have three states, including "0", "1", and don't care "X", making each bit "ternary." In this embodiment, the ternary state is indicated by the program or erase state of the two memory cells of each TCAM cell. Thus, a TCAM cell 110 on word line WL1 includes memory cells on NAND string 150 and NAND string 151 which are coupled respectively to bit lines BL(0) and BL(1). Other TCAM cells are distributed along the row on corresponding pairs of bit lines on word line WL1.

The circuit of FIG. 1 includes a circuit to select a set of TCAM cells in the sets of TCAM cells, where in this example a set of TCAM cells includes the TCAM cells along a single row on a single word line in the block. The circuit to select the set of TCAM cells can comprise a word line decoder and driver responsive to addresses from a controller, as used in nonvolatile memory circuits.

The circuit of FIG. 1 includes a circuit to apply an input search word including, true and complement states, or in some cases ternary states, of each bit in the input search word, to respective TCAM cells in the selected set of TCAM cells. In this example, a search word register 101 is coupled to the bit lines BL(0) to BL(x), where x can be on the order of thousands (only four are shown in the figure). As indicated by the labeling FIG. 1, search word may comprise 8 k bytes (64 k bits) in an example system. The size of the search word register can be adapted to a particular memory implementation, and make can be very large.

For a TCAM search, each bit of a search word is represented by a true value and a complement value to be applied respectively to the two memory cells of the selected TCAM cell. In some cases, a "don't care" state can be represented in bits of the search word as well. Thus, for the four illustrated bit lines, to search bits are applied by applying SB(0) and/SB(0) to bit lines BL0 and BL1 respectively, and by applying search bits SB(1) and/SB(1) to bit lines BL2 and BL3 respectively. The search word register can be implemented in the manner of a page buffer as is commonly used in NAND memory architectures, and in some embodiments, the page buffer used for memory operations and the search word register used for TCAM operations can be include the same buffer cells.

As shown in FIG. 1, the source line SL1 is connected to a sense amplifier 120 that can include an analog to digital converter ADC. Sense amplifier 120 can output a multibit value having "x" bits on bus 121 indicating the results of a TCAM match operation. For example, the output on bus 121 can be eight bits. In other embodiments, the output on bus 121 can be a single bit. In this example, the output on bus 121 is applied to a comparator 122, at which the similarity value is compared to a threshold 123. The output of the comparator 122 can be single bit indicating whether the accessed stored word passes the similarity match at the threshold. The comparison operation can be performed in an external host in some embodiments. But this example places the logic for the comparison close to the sense amplifier 120 in the memory device.

The sense amplifier 120 provides a circuit to combine outputs of the TCAM cells in the selected set of TCAM cells to generate an output indicating a degree to which the input search word matches the stored word in the selected set of TCAM cells. In this example, in order to perform a TCAM match of an input search word with a selected stored word, the stored word is selected by setting the word line for the selected stored word to a read voltage Vread, and setting the word lines for unselected stored words to a pass voltage Vpass. The input search word is applied by the search word register to the bit lines. The results of the match comprise a current which is conducted in NAND strings in which a mismatch state is established by the combination of the search word and the selected stored word. The conditions in which the mismatch state results in current flow are described in FIG. 2 below.

The current of the selected NAND strings is determined by the data stored in the memory cells at a selected level of the NAND block, and bias on the bit lines as indicated by bits of the search word.

As illustrated, the current on the source line SL1 includes a sum of the current on the bit lines BL(0) to BL(x) through the NAND strings in the row to the source line SL1.

A zero current on SL1 corresponds to an exact match, in the state in which no mismatch is detected by any TCAM cell in the row. A non-zero current accumulated on SL1 corresponds to a number of mismatch states. One mismatch results in current on one NAND string, and more than one mismatch results in current on more than one NAND string. The output on bus 121 of the sense amp 120 can be a digital value representing the magnitude of the mismatch. In one example, the digital value can have a width "x" of eight bits. This digital value can be compared to a threshold that indicates a similarity level of the search word and the stored word. For example, the threshold can be set at a level that corresponds to current generated by more than three mismatches. So that a given stored word can be indicated as similar to a search word if it results in less than or equal to a number such as three mismatches, or in cases using an 8 bit ADC in which each count represents one mismatch, the threshold can be set at 256 mismatches. The threshold can be set as desired according to a particular implementation of the circuit. Some embodiments, the threshold can be programmable and adjustable for each matching operation of set of matching operations, by setting a value in a control register on an integrated circuit including the circuitry.

Figure 2:
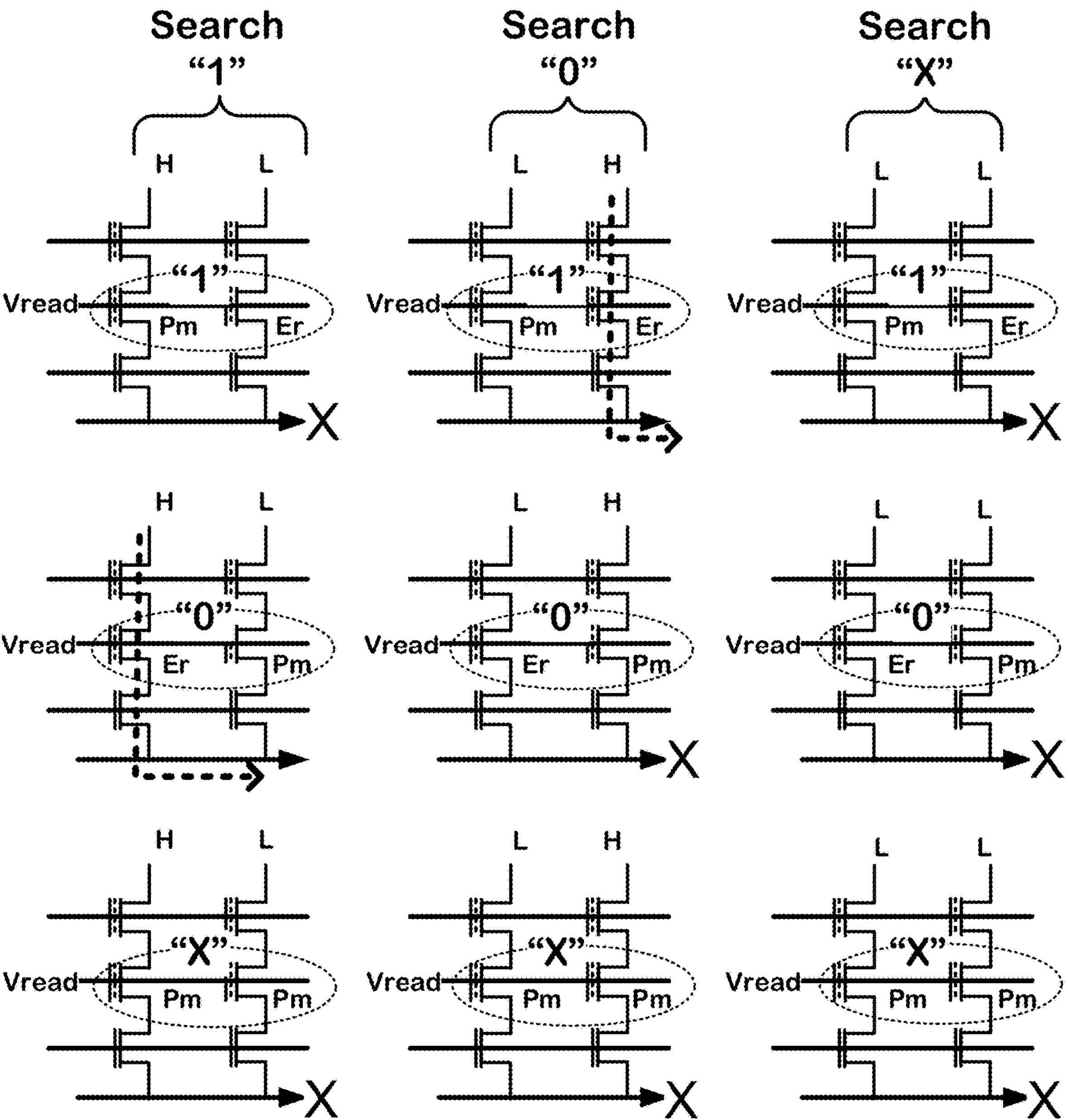
FIG. 2 is an illustration of nine conditions of operation for a NAND architecture TCAM cell in a circuit like that of FIG. 1.

FIG. 2 illustrates nine match conditions for TCAM cells like those described with reference to FIG. 1. Nine TCAM cells are illustrated in which the state stored in the cell corresponds to "1" in the top row, "0" in the middle row and "X" in the bottom row. The search bit of the search word in the first column is "1", in the second column is "0", and in the third column is "X".

As labeled in the drawing, a stored state of "1" is represented when the memory cell on the left is written with a high program state threshold (Pm) and the memory cell on the right is written with a low erase state threshold (Er); a stored state of "0" is represented when the memory cell on the left is written with a low erase state threshold (Er) and the memory cell on the right is written with a high program state threshold (Pm); and a stored state of "X" is represented when both the memory cell on the left and the memory cell on the right are written with a high program state threshold (Pm). A mismatch state occurs which results in current flow (indicated by dotted lines in the figure) only in the condition in which a bit line is biased with a high-voltage and the memory cell receiving the read voltage has a low erase state threshold. Thus, the mismatch occurs which results in current flow only in the search "0" column in the first row in which the TCAM cell stores "1"; and in the search "1" column in the second row in which the TCAM cell stores "0". All other conditions indicate a match in which no current is produced.

Figure 3:
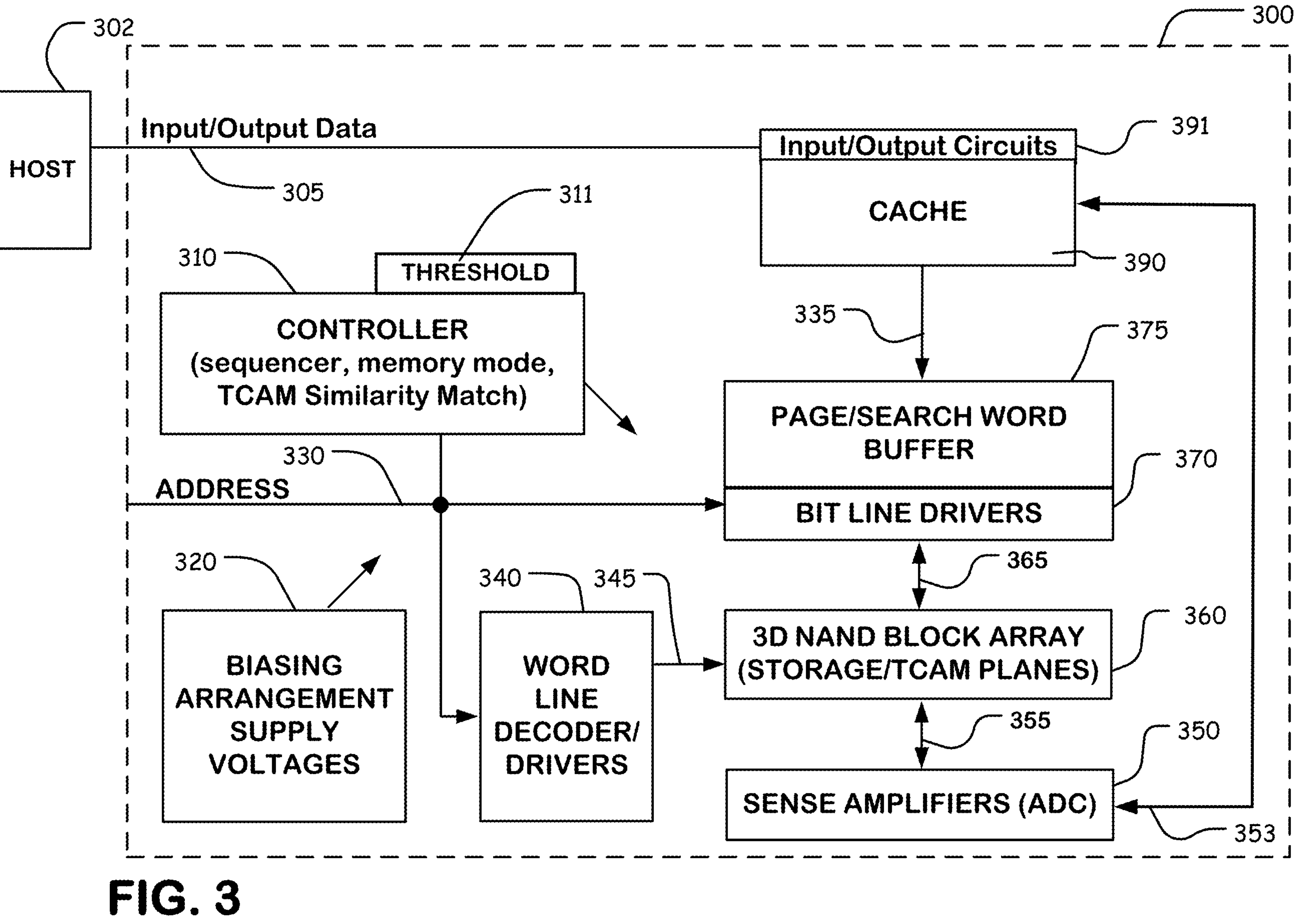
FIG. 3 is a simplified block diagram of an integrated circuit comprising a NAND architecture memory configured as TCAM with similarity matching.

FIG. 3 is a simplified chip block diagram of another embodiment of an integrated circuit device 300 including NAND block array 360 of flash memory cells, implemented for example, as shown in FIG. 1. The device is configured for memory operations, including page program, program, read, erase, or other operations, and for TCAM operations. In various embodiments, the memory device may have single-level cells (SLC), or multiple-level cells storing more than one bit per cell (e.g., MLC, TLC or XLC). The memory device can be implemented on a single integrated circuit chip, on a multichip module, or on a plurality of chips configured as suits a particular need.

The device 300 in this example includes a controller 310, that includes control circuits such as state machines and other logic circuits, for memory operations in a storage mode, and TCAM operations including similarity match operations as described herein. Also, control circuits in the controller 310 in this example include a sequencer for controlling use of the device 300 in large scale TCAM functions involving the NAND block array 360, and data flow operations inside and outside of the device. Also, the controller 310 can include or have access to control registers storing parameters of operation of the device, including a threshold register 311 storing a parameter setting a threshold for similarity matching.

An example of a NAND block array technology that can be used in the device 300 is described in U.S. Patent Application Publication No. US20200192971A1, which is incorporated by reference as if fully set forth herein.

The NAND block array 360 can include 2 or more planes; including one or more for storage operations, and one or more for TCAM operations. The controller can include control state machines supporting data transfer from the plane for storage to the plane for TCAM operation, using address computation schemes such as transpose matrix operations and mapping tables.

A NAND block as described herein can be implemented using a 3D NAND memory technology. Some examples, among a variety of alternatives known in the art, of NAND blocks including vertical NAND strings are described in U.S. Pat. No. 9,698,156, entitled VERTICAL THIN CHANNEL MEMORY, by Luc, issued 04 Jul. 2017; and U.S. Pat. No. 9,524,980, entitled U-SHAPED VERTICAL THIN CHANNEL MEMORY, by Lue, issued 20 Dec. 2016; and such patents are incorporated by reference as if fully set forth herein. Implementations can also be made using 2D NAND technology, in which the NAND block is logically defined across the plurality of 2D NAND arrays. The block array 360 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, ferroelectric memory cells phase change memory cells, and other types of non-volatile and volatile memory cell technologies.

The integrated circuit device 300 includes a set of source lines 355 coupled to corresponding NAND blocks in the array 360, and a set of bit lines 365 coupled to corresponding NAND blocks in the array 360.

A set of word lines is coupled to gates of the memory cells at corresponding levels of the NAND blocks, signals on the word lines in the set of word lines selecting respective levels of memory cells. Word line drivers 340 are coupled to a set of word lines 345.

A set of sensing circuits 350 is coupled to respective source lines in the set of source lines. For TCAM operations using the array, the source line sensing circuits 350 can sense current at source lines 355 from the NAND block array 360. Currents sensed at a particular source line in the set of source lines can represent a similarity value as discussed above. Sensed data for memory operations, and metadata about the sensed data in the TCAM operations including information such as tags to be written at similarity matching stored words, addresses of similarity matching stored words and similarity values (provided by an analog to digital converter ADC for example) for similarity matching stored words, from the source line sensing circuits 350 are supplied via data lines 353 to cache memory 390, to input/output circuits 391, or to other destinations on or off chip as desired. The sensing circuits 350 can include current limiting circuits that limit the power consumption for mismatched stored word which may have many mismatching bits. For example, the current limiting circuits can limit current at levels corresponding to mismatching in for example, 5 to 10 locations of the stored word or in some cases larger numbers such as 256 locations for an embodiment with an eight bit ADC as discussed above. The current limit can be set according to the needs of the particular implementation.

Bit line drivers in circuits 370 are coupled to a page buffer 375, and to bit lines 365. The page buffer 375 can be configured for operations as a search word buffer, or include a set of storage elements like latches used as a search word buffer, in TCAM operations. For memory storage operations, input and output data can be provided through the cache 390 across lines 335. For TCAM operations using the array, bit line drivers in circuits 370 can apply true and complement values, or ternary values, of the bits of a search word for each TCAM match operation.

Addresses are supplied on bus 330 from controller 310 to page buffer 375, bit line drivers in circuits 370 and word line drivers 340. Page buffer 375, bit line drivers in circuits 370, and source line sensing circuits 350 are coupled to the input/output circuits 391 by lines 353, 305.

Input/output circuits 391 drive the data to destinations external to the integrated circuit device 300. Input/output data and control signals are moved via data bus 305 between the input/output circuits 391, cache 390, the controller 310 and input/output ports on the integrated circuit device 300 or other data sources internal or external to the integrated circuit device 300, such as a general purpose processor or special purpose application circuitry, or a combination of modules providing system-on-a-chip functionality supported by the NAND block array 360.

The cache 390 can be used in the TCAM mode for temporarily storing match results, such as stored words passing a similarity match, and metadata about the stored words subject of the TCAM operations. Also, logic circuits can be connected to the cache and in the data path between the cache and the page buffer 375, to do logic operations using the results of the TCAM operations stored in cache.

In the example shown in FIG. 3, controller 310, using a bias arrangement state machine, controls the application of supply voltages generated or provided through the voltage supply or supplies in block 320 for TCAM operations and for read and write (program and erase) operations in a storage mode.

The controller 310 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

External host 302 can be connected to the input/output circuits 391 on bus 305 and include resources to support storage operations and TCAM operations as described herein. The host 302 can comprise a general-purpose processor, a special purpose processor, a processor configured as a memory controller, or other processor that uses the memory device 300. All or part of the host 302 can be implemented on the same integrated circuit as the memory. In example systems, the host 302 can comprise a digital processing system including a memory controller to interface with the device 300, and may be a system including DRAM and GPU circuits in some examples, for further computations.

In the illustrated example, the host 302 is coupled to data bus 305 on the memory device 300, as well as other control terminals not shown, such as chip select terminals and so on, and can provide commands or instructions to the memory device 300. In some examples, the host 302 can be coupled to the memory device using a serial bus technology, using shared address and data lines.

The host 302 can include a file system or file systems that store, retrieve, and update data stored in the memory based on requests from an application program. In general, the host 302 can include programs that perform memory management functions and other functions that can produce status information for data stored in the memory. Also, the host 602 can include application programs, file systems, flash translation layer programs and other components that can produce status information for data.

Control logic in the controller 310 can also implement circuitry to support pipeline or sequential operations in a TCAM mode of the device. For example, the following operations can be implemented using the control logic in the controller 310, after storage of a data set in the memory TCAM planes, a TCAM operation can include:

1. Loading a first search word in the page buffer 375.
2. Selecting a first stored word, such as by applying a read voltage to a selected word line in a selected block or blocks.
3. Applying the search word to the bit lines for the selected stored word and enabling the string select line for the row of the first stored word.
4. Determining from the output of the sense amplifier whether the selected stored word is similar to the search word.
5. If the selected stored word is similar to the search word, then logging metadata, such as the address of the selected stored word such as by storing the address offset in a register or in a designated area in the cache 390, and moving the selected stored word to the cache 390. In some embodiments, movement of the selected stored word to the cache can be implemented using a following access cycle using the stored address offset.

6. If the selected stored word is not similar to the search word, then skipping the transfer of the selected stored word to the cache.
7. After step 5 or 6, the controller determines whether the last stored word has been reached in the procedure, and if not selects a next storage word in the sequence.

If the last stored word has been reached in the procedure, the algorithm ends.

In this manner, stored words that are indicated to be similar to the search word can be selected for transfer to the digital system for further processing, while stored words that are not similar to the search word can be skipped. This can substantially reduce the time required digital processing of a large data set, by eliminating the transfer sequences for stored words that are not similar to the search word.

Figure 4:
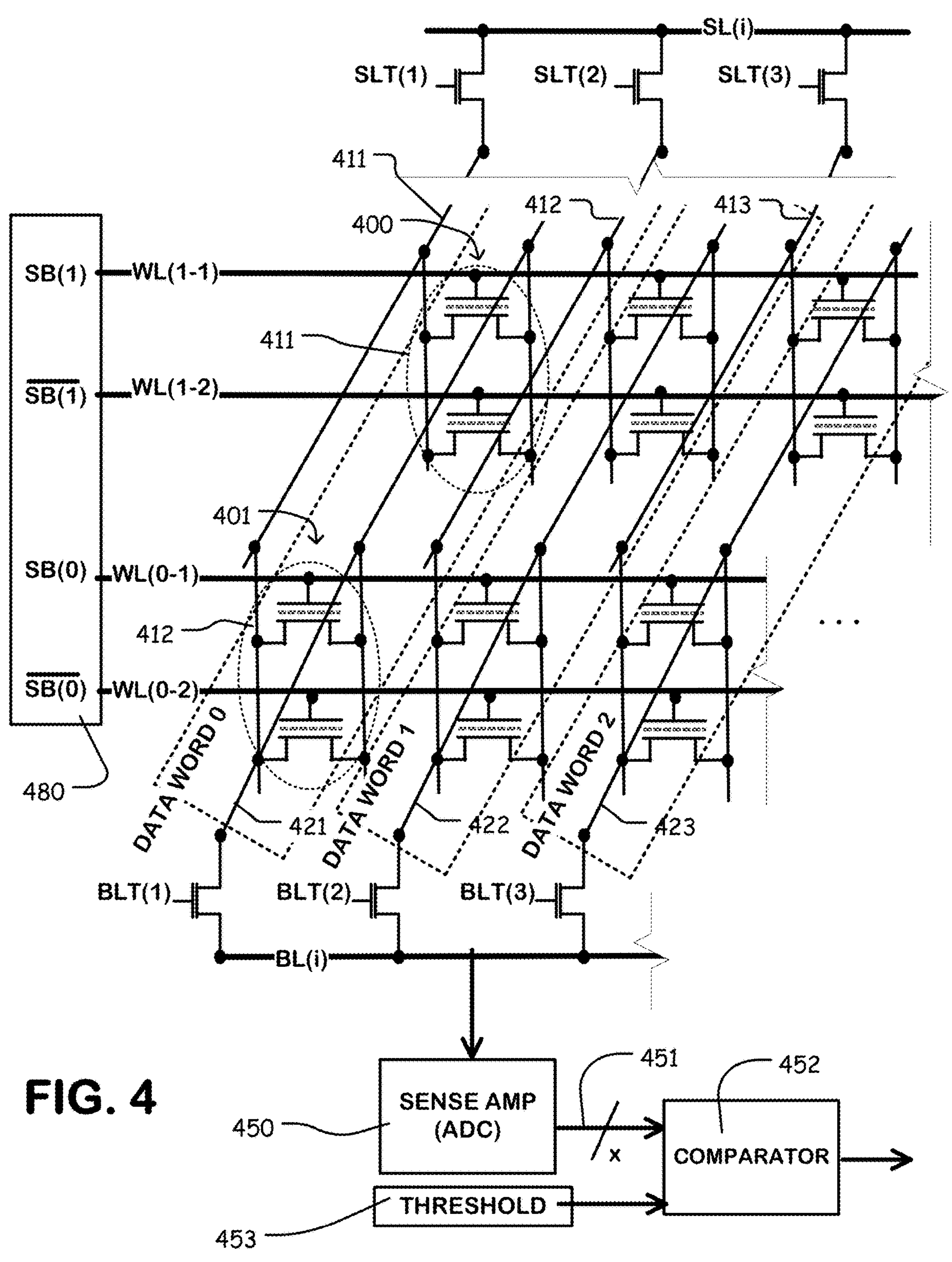
FIG. 4 is a simplified circuit diagram of a 3D nonvolatile AND architecture memory configured as TCAM with similarity matching.

FIG. 4 is a schematic diagram of a AND block including an array of vertically stacked AND cells arranged in rows and columns. A column of the AND block for the purposes of this description is a set of AND cells having a common bit line and source line pair (e.g. 411, 421) and a plurality of word lines (WL0 to WLn) in a single level of the block. To simplify the drawing, only two word lines per level are illustrated, including WL(0-1) and WL(1-1) on the first level, and WL(0-2) and WL(1-2) on the second level. It is contemplated that many word lines per level and many levels of word lines can be utilized including hundreds or thousands of word lines in a given block.

In 3D AND, there can be many word lines that can support using large search words. For example, each tile in a 3D AND architecture may have 8 K word lines, which supports parallel searching using a 512 byte search word.

In a AND architecture, paired word lines are used to apply search bits, and the ternary state data in the array is stored in a corresponding fashion in pairs of cells.

In this architecture, a "Match" produces no current, while "Mismatch" produces currents.

The global bit line can combine the cell currents driven by the large number of word lines. Thus a total summed current can be quite large. An ADC can be used to collect the summed currents, with for example 8-bit resolution.

More current indicates more "mismatch", while less current means more "match". Bit line select gate bias to clamp the maximum current, when high mismatch accuracy is not important.

As illustrated in FIG. 4, the AND memory cells are arranged in stacks (e.g. 400, 401), in which each stack includes a local stack source line and a local stack bit line. The local stack source line and local stack bit line extend vertically to corresponding source lines a (e.g. 411) and bit lines (e.g. 421) in patterned conductor layers overlying the stacks. In this example, three columns of stacks are illustrated, although in other embodiments there can be thousands of columns per block.

Multiple columns of vertical stacks of AND cells are illustrated on corresponding source line/bit line pairs (411/421, 412/422, 413/423).

Each of the source lines 411, 412, 413 is connected to a global source line SL(i) by a corresponding source line select transistor controlled by signals SLT(1), SLT(2), SLT(3), . . . .

Likewise, each of the bit lines 421, 422, 423 is connected to a global bit line BL(i) by a corresponding bit line select transistor controlled by signals BLT(1), BLT(2), BLT(3), . . . .

Each global bit line BL(i) is coupled to a sense amplifier circuit 450, which can include an analog-to-digital converter. There can be embodiments in which many bit lines share a single sense amplifier circuit, and subsets of the bit lines sharing the single sense amplifier are selected by column decoding circuits for a given access cycle. An output of the sense amplifier circuit 450 is applied on bus 451, and can comprise a digital value having "x" bits. For example, the output on bus 451 can comprise eight bits. In other embodiments, the output on line 451 can be a single bit. In this example, the output on bus 451 is applied to a comparator 452, at which the similarity value is compared to a threshold 453. The output of the comparator 452 can be single bit indicating whether the accessed stored word passes the similarity match at the threshold. The comparison operation can be performed in an external host is some embodiments. But this example places the logic for the comparison close to the sense amplifier circuit 450.

Each of the stacks of AND cells in the array of stacks includes a plurality of memory cells arranged in parallel between the corresponding local stack bit line and local stack source line, and coupled to corresponding word lines in each level. In this example, each of the word lines in a given level of the AND block are coupled to separately controlled single word line conductors, such that each row of memory cells in a given level can receive a different word line signal. In some embodiments all the word lines for a set of word lines including more than one member, in a given block are coupled to a single word line conductor, so that all or a selected plurality of the rows of memory cells in a given level of lot AND block can receive the same word line signal.

In a storage mode of operation, data can be written to the individual memory cells using program and erase operations supported by page buffers, or circuits for applying input in receiving output data, coupled to global bit lines of corresponding blocks. Using the page buffers or other circuits, a data pattern can be programmed into the individual stacks of AND cells in a selected row of the array of AND stacks, coupled to a plurality of bit lines in parallel at each level of the AND block. Also, the page buffer or similar circuitry, in the storage mode can be utilized to read data stored in the memory cells of the selected row of the block of AND stacks at each level.

In a storage mode, large data set of data words can be stored into the AND block. The AND cells in the AND block can be implement using single-bit-per-cell technology, or multiple-bit-per-cell technology.

A AND block as described herein can be implemented using a 3D AND memory technology. Some examples, among a variety of alternatives known in the art, of AND blocks including vertical AND stacks are described in U.S. Pat. No. 11,133,329B2; which is incorporated by reference as if fully set forth herein. Implementations can also be made using 2D AND technology, in which the AND block is logically defined across the plurality of 2D AND arrays.

A system including the AND block illustrated in FIG. 4 is an example of a circuit including an array of memory cells arranged to hold stored words (e.g. DATA WORD 0, DATA WORD 1, DATA WORD 2, . . . ) in respective sets of TCAM cells, each TCAM cell in the sets of TCAM cells including first and second memory cells of the array to store ternary states of a bit of the respective stored words. In this example, a TCAM cell includes one memory cell in a given AND stack at a first word line level (e.g. stack 401, word line WL(0-1)) and a second memory cell in the same AND stack at a second word line level (e.g. stack 401, word line WL(0-2)). A data set that comprises a plurality of stored words, each stored word in this example being stored in a column of AND cell stacks selected by a pair of source line select and bit line select transistors (e.g. SLT(1)/BLT(1)), and plurality of a pairs of word lines (e.g. word line WL(0-1)), word line WL(0-2)).

Thus DATA WORD 0 is stored in the column selected by SLT(1) and BLT(1), DATA WORD 1 stored in the column selected by SLT(2) and BLT(2), and DATA WORD 2 stored in the column selected by SLT(3) and BLT(3).

Each bit in a stored word can have three states, including "0", "1", and a don't care state "X", as indicated by the program or erase state of the two memory cells of each TCAM cell. Thus a TCAM cell in AND stack 401 includes memory cells on word lines WL(0-1) and WL(0-2). TCAM cell in AND stack 400 includes memory cells on word lines WL(1-1) and WL(1-2). Other TCAM cells are distributed along the column on corresponding pairs of word lines and AND cell stacks.

The circuit of FIG. 4 includes a circuit to select a set of TCAM cells in the plurality of sets of TCAM cells, where in this example set of TCAM cells includes the TCAM cells on a single column on a single bit line/source line pair in the block. The circuit to select the set of TCAM cells can comprise a bit line/source line decoder responsive to addresses from the controller, as used in nonvolatile memory circuits.

The circuit of FIG. 4 includes a circuit to apply an input search word, including true and complement, or ternary, states of each search bit (SB(0),/SB(0) and SB(1),/SB(1)) in the input search word, to respective TCAM cells in the selected set of TCAM cells. In this example, a search word register 480 is coupled to the word lines WL(1-1), WL(1-2), WL(0-1), WL(0-2), where there can be a large number of word lines along the column. The search word register 480 can be coupled to or include word line drivers that are also used in the storage mode in response to addressing. The sizes of a search word register can be very large in some embodiments. In other embodiments, a search word register that is smaller than a search word to be utilized in the operation can be shared amongst the plurality of groups of word lines for storing partial search words.

For a TCAM search, each bit of the search word is represented by two bits representing a true state, a complement state and optionally a don't care state, to be applied respectively to two memory cells of the selected TCAM cell. Thus, for the illustrated embodiment, the search bits are applied by applying SB(0) and/SB(0) to word lines WL(0-1) and WL(0-2) respectively, and by applying search bits SB(1) and/SB(1) to bit lines WL(1-1) and WL(1-2) respectively.

As shown in FIG. 4, a global bit line is connected to a sense amplifier circuit 450, which can include an analog to digital converter. The sense amplifier circuit 450 can output a multibit value having "x" bits on bus 451 indicating results of a TCAM match operation. For example, the output on bus 451 can be eight bits. In other embodiments the output on bus 451 can be a single bit.

The sense amplifier circuit 450 provides a circuit to combine the outputs of the TCAM cells in the selected set of TCAM cells to generate an output indicating a degree to which the input search word matches the stored word stored in the selected set of TCAM cells. Thus, in this example, in order to perform a TCAM match of an input search word with the selected stored word, the stored word is selected by setting the source line SL(i) and bit line BL(i) to operating values, and enabling the source line and bit line select transistors corresponding to the selected column that includes the selected set of TCAM cells.

The results of the match comprise a current which is conducted in the AND stacks at which a mismatch state is established by the combination of the search word and the selected stored word. The conditions in which the mismatch state results in current flow are described in FIG. 5 below.

The current of the selected AND stacks is determined by the data stored in the memory cells in a column of AND stacks of the AND block selected by the SLT/BLT select transistors, and bias on the word lines as indicated by true and complement bits of the search word.

As illustrated, the current on the bit line BL(i) includes a sum of the current in the AND cell stacks 400 and 401, and other stacks in the column.

A zero current on BL(i) corresponds to an exact match, in the state in which no mismatch is detected by any TCAM cell in the column. A non-zero current accumulated on BL(i) corresponds to a number of mismatch states. One mismatch results in current on one AND stack, and more than one mismatch results in current on more than one AND stack. The output on bus 451 of the sense amplifier circuit 450 can be a digital value representing the magnitude of the mismatch. In one example, the digital value can have a width "x" of eight bits. This digital value can be compared to a threshold that indicates a similarity level of the search word and the stored word. For example, the threshold can be set at a level that corresponds to current generated by more than three mismatches. So that a given stored word can be indicated as similar to a search word if it results in less than or equal to a number such as three mismatches, or in cases using an 8 bit ADC in which each count represents one mismatch, the threshold can be set at 256 mismatches. The threshold can be set as desired according to a particular implementation of the circuit. Some embodiments, the threshold can be programmable and adjustable for each matching operation of set of matching operations, by setting a value in a control register on an integrated circuit including the circuitry.

The threshold can be set as desired according to a particular implementation of the circuit. Some embodiments, the threshold can be programmable by setting a value in a control register on an integrated circuit including the circuitry.

Figure 5:
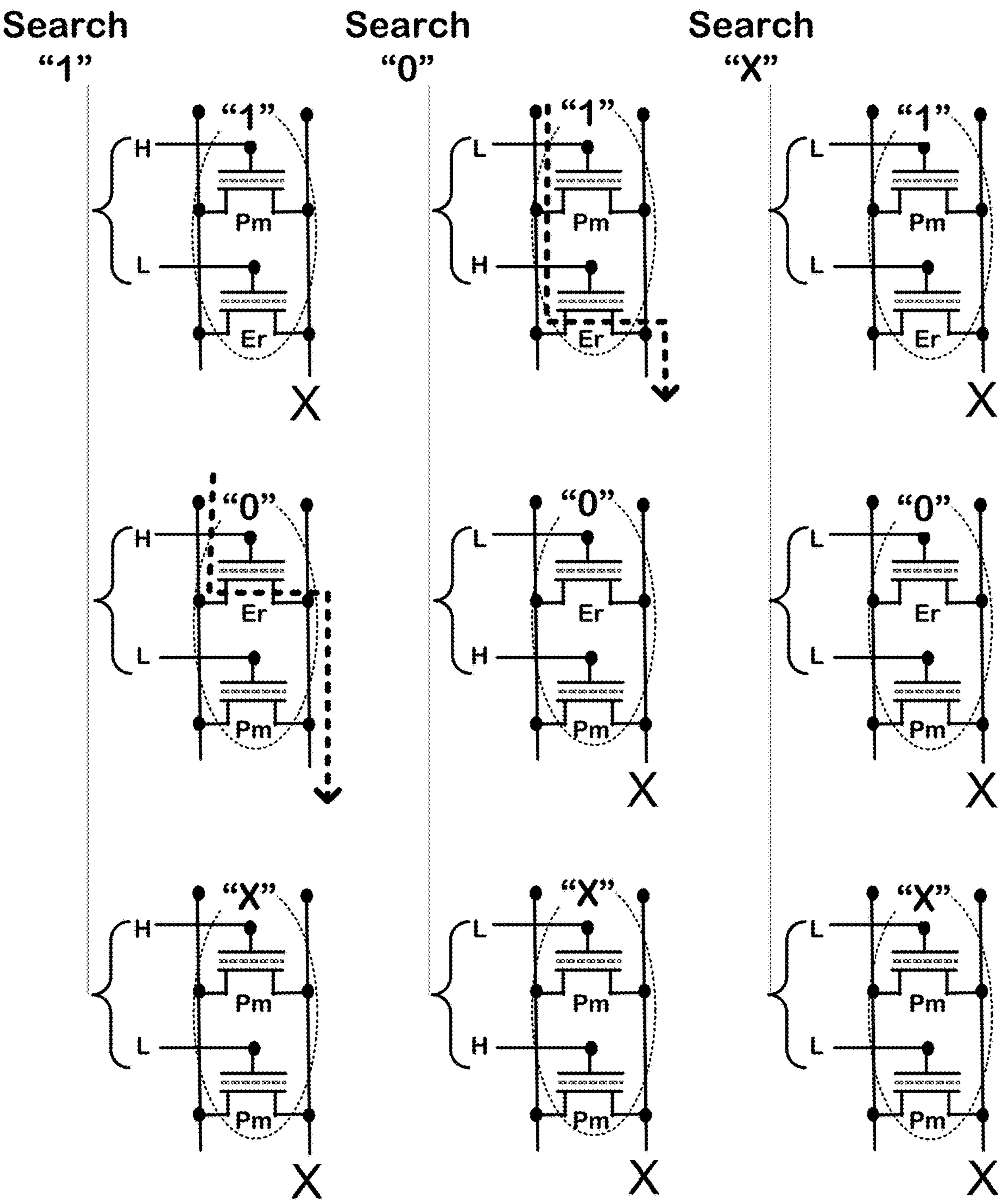
FIG. 5 is an illustration of nine conditions of operation for a AND architecture TCAM cell in a circuit like that of FIG. 4.

FIG. 5 illustrates nine match conditions for TCAM cells like those described with reference to FIG. 4. Nine TCAM cells are illustrated in which the state stored in the cell corresponds to "1" in the top row, "0" in the middle row and "X" in the bottom row. The search bit of the search word applied on the word line pair of the cell in the first column is "1", and the second column is "0", and in the third column is "X".

As labeled in the drawing, a stored state of "1" is represented when the memory cell on the top is written with a high program state threshold (Pm) and the memory cell on the bottom is written with a low erase state threshold (Er); a stored state of "0" is represented when the memory cell on the top is written with a low erase state threshold (Er) and the memory cell on the bottom is written with a high program state threshold (Pm); and a stored state of "X" is represented when both the memory cell on the top and the memory cell on the bottom are written with a high program state threshold (Pm). A mismatch state occurs which results in current flow (indicated by dotted lines in the figure) only in the condition in which a word line is biased with a read voltage ("H") and the memory cell receiving the read voltage has a low erase state threshold. Thus, the mismatch occurs which results in current flow, only in the search "0" column in the first row in which the TCAM cell stores "1"; and in the search "1" column in the second row in which the TCAM cell stores "0". All other conditions indicate a match in which no current is produced.

The 3D architecture described with reference to FIG. 4 in this document can be referred to as a 3D AND device. While 3D AND is primarily described, the technology disclosed is not limited thereto and can also be implemented as a 3D NOR device. Sec, e.g. Cooke, "Flash memory 101: An introduction to NAND flash," EDN, Mar. 20, 2006, FIG. 1, which is incorporated by reference as if fully set forth herein.

Figure 6:
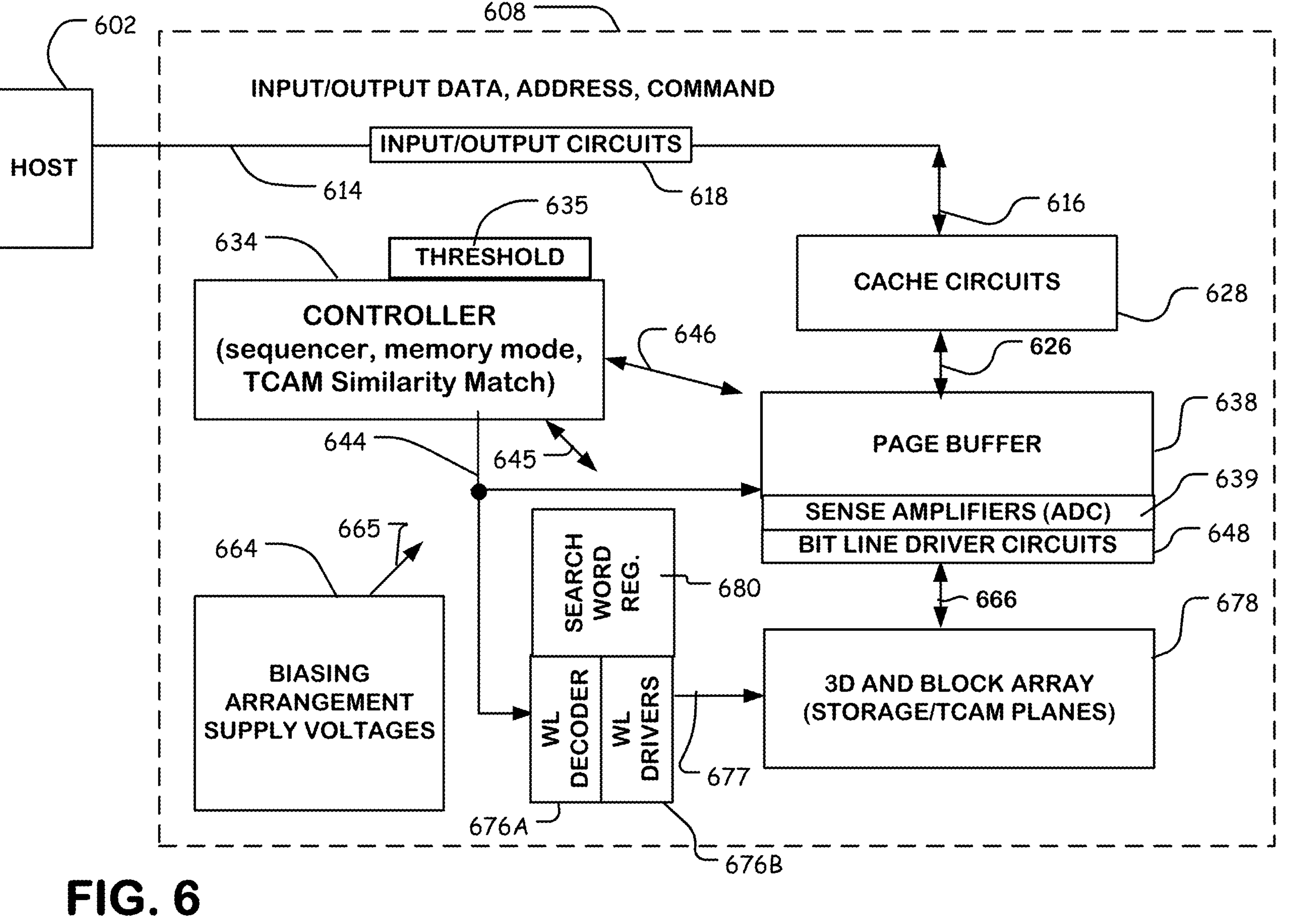
FIG. 6 illustrates a simplified block diagram of 3D nonvolatile AND architecture memory configured as TCAM with similarity matching.

FIG. 6 is a simplified diagram of a memory system including a 3D AND flash memory device 608 implemented on an integrated circuit and a host 602. The device 608 is configured for memory operations, including page program, program, read, erase, or other operations, and for TCAM operations. In various embodiments, the memory device 608 may have single-level cells (SLC), or multiple-level cells storing more than one bit per cell (e.g., MLC, TLC or XLC). The memory device 608 can be implemented on a single integrated circuit chip, on a multichip module, or on a plurality of chips configured as suits a particular need.

The device 608 in this example includes a controller 634, that includes control circuits such as state machines and other logic circuits, for memory operations in a storage mode, and TCAM operations including similarity match operations as described herein. Also, control circuits in the controller 634 in this example include a sequencer for controlling use of the device 608 in large scale TCAM functions involving the AND block array 678, and data flow operations inside and outside of the device. Also, the controller 634 can include or have access to control registers storing parameters of operation of the device, including a threshold register 635 storing a parameter setting a threshold for similarity matching.

The memory device 608 includes a AND block array 678, which can be a 3D AND flash memory implemented using three-dimensional array technology. In some embodiments, the AND block array 678 comprises an array of vertical AND stacks in a dense 3D configuration. In other embodiments the AND block array 678 can comprise a two-dimensional array of AND cells. The AND block array 678 can comprise a plurality of planes of memory blocks, including one or more blocks configured for storage operations and one or more blocks configured for TCAM operations as described herein.

A word line decoder 676A is coupled via word line driver circuits 676B to a plurality of word lines 677 in the AND block array 678. The word line driver circuits 676B are also coupled to a search word buffer 680, used to apply search words to the word lines in TCAM operations as described above.

Page buffer circuits 638 are coupled by bit line driver circuits 648 to bit lines 666 in the AND block array 678. In some embodiments, column decoder circuits can be included for routing data from the bit line drivers to selected bit lines. The page buffer circuits 638 can store pages of data that define a data pattern for a page program operation. In this example, sense amplifiers 639, which can include ADCs, configured for similarity matching in the TCAM mode and for data operations in the storage mode are disposed on the bit lines. The sense amplifiers 639 can include current limiting circuits that limit the power consumption for mismatched stored word which may have many mismatching bits. The current limit can be set according to the needs of the particular implementation.

Bit lines for memory arrays can comprise global bit lines (GBL) and local bit lines. Bit lines generally comprise conductors in higher patterned layers that traverse a plurality of blocks of memory cells in an array and connect to local bit lines in the blocks via block select transistors or bank select transistors. The local bit lines are connected to the memory cells for current flow to and from the bit lines, which in turn are connected to the bit line driver circuits 648, page buffer circuits 638 and sense amplifiers 639. Likewise, the word lines can include global word lines and local word lines with corresponding supporting circuits in the word line driver circuits 676B.

In a sensing operation, sensed data are supplied via data lines in bus system 626 to cache 628, which are in turn coupled to input/output circuits 618 via data path lines 616. Also, input data is applied in this example to the cache 628 on lines 616, and to the page buffer circuits 638 on bus system 626, for use in support of program operations.

The cache 628 can be used in the TCAM mode for temporarily storing match results, such as stored words passing a similarity match, and metadata about the stored words subject of the TCAM operations. Also, logic circuits can be connected to the cache 628 and in the data path between the cache 628 and the page buffer 638 and sense amplifiers 639, to do logic operations using the results of the TCAM operations stored in cache.

Input/output circuits 618 are connected by line 614 (including I/O pads) and provide communication paths for the data, addresses and commands with destinations external to the memory device 608, including the host 602 in this example. The input/output circuits 618 provide a communication path by line 616 to cache 628. The cache 628 are in data flow communication (using for example a bus system 626) with page buffer circuits 638 and sense amplifiers 639.

Controller 634 are connected to the input/output circuits 618, and include command decoder logic, address counters, state machines, timing circuits and other logic circuits that control various memory operations in support of storage mode operations, including program, read, and erase operations for the AND block array 678, and TCAM operations including similarity match operations as described herein.

Control circuit signals are distributed to circuits in the memory device, as shown by arrows 645, 646, as required to support the operations of the circuits. The controller 634 can include address registers and the like for delivery of addresses as necessary to the components of the memory device 608, including delivery to the cache 628, and on line 644 to the page buffer circuits 638 and word line decoder 676A in this illustration.

In the example shown in FIG. 6, controller 634 include control logic circuits that include modules implementing a bias arrangement state machine, or machines, which controls, or control, the application of bias voltages generated or provided through the voltage supply or supplies in block 664, such as read, erase, verify and program voltages including precharge voltages, pass voltages and other bias voltages as described herein to word line driver circuits 676B and bit line driver circuits 648, for a set of selectable program and read operations. Bias voltages are applied as represented by arrow 665, to components of the memory device 608, as necessary for support of the operations.

The controller 634 also supports loading the search word buffer 680 with search words or partial search words in support of TCAM operations as described herein. Control logic in the controller 634 can also implement circuitry to support pipeline or sequential operations in a TCAM mode of the device. For example, the following operations can be implemented using the control logic in the controller 634, after storage of a data set in the memory TCAM planes, a TCAM operation can include:

1. Loading a first search word in the search word buffer 680.
2. Selecting a first stored word, such as by applying a select voltages to a selected bit line select transistor and source line select transistor in a selected block or blocks.
3. Applying the search word to the word lines for the selected stored word.
4. Determining from the output of the sense amplifier whether the selected stored word is similar to the search word.
5. If the selected stored word is similar to the search word, then logging metadata, such as the address of the selected stored word such as by storing the address offset in a register or in a designated area in the cache 628, and moving the selected stored word to the cache 628. In some embodiments, movement of the selected stored word to the cache can be implemented using a following access cycle using the stored address offset.
6. If the selected stored word is not similar to the search word, then skipping the transfer of the selected stored word to the cache.
7. After step 5 or 6, the controller determines whether the last stored word has been reached in the procedure, and if not selects a next storage word in the sequence.

If the last stored word has been reached in the procedure, the algorithm ends.

In this manner, stored words that are indicated to be similar to the search word can be selected for transfer to the digital system for further processing, while stored words that are not similar to the search word can be skipped. This can substantially reduce the time required digital processing of a large data set, by eliminating the transfer sequences for stored words that are not similar to the search word.

The controller 634 can include modules implemented using special-purpose logic circuitry including state machines, as known in the art. In alternative embodiments, the controller 634 can include modules implemented using a general-purpose processor, which can be implemented on the same integrated circuit, which execute a computer program to control the operations of the memory device 608. In yet other embodiments, a combination of special-purpose logic circuitry and a general-purpose processor can be utilized for implementation of modules in controller 634.

The block array 678 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, ferroelectric memory cells, phase change memory cells, and other types of non-volatile and volatile memory cell technologies.

In the illustrated example, the host 602 is coupled to lines 614 on the memory device 608, as well as other control terminals not shown, such as chip select terminals and so on, and can provide commands or instructions to the memory device 608. In some examples, the host 602 can be coupled to the memory device using a serial bus technology, using shared address and data lines.

The host 602 can include resources to support storage operations and TCAM operations as described herein. In example systems, the host 602 can comprise a digital processing system including a memory controller to interface with the device 608, and may be a system including DRAM and GPU circuits in some examples, for further computations. The host 602 can comprise a general-purpose processor, a special purpose processor, a processor configured as a memory controller, or other processor that uses the memory device 608. All or part of the host 602 can be implemented on the same integrated circuit as the memory.

The host 602 can include a file system or file systems that store, retrieve, and update data stored in the memory based on requests from an application program. Also, the host 602 can include application programs, file systems, flash translation layer programs and other components that can produce status information for data stored in the memory, including information marking data invalid as a result of such functions.

In embodiments described above, a search word matching step can be executed in a single TCAM access, because the search word and stored word can have a size that is equal to or less than the width of the data access path used in the operation. For very large search words, a NAND architecture can be utilized, which are commonly implemented with a page buffer thousands of bytes wide and can support search word buffers of the same width. In a AND architecture like that of FIG. 4, the search word buffer is disposed on the word line path. In these kinds of memory, word line drivers are often shared by multiple blocks, and therefore may have a relatively narrow width compared to a desired search word width. To support very large search words, additional word line driving to support a wide search word buffer can be used on the word line driver side of the array. Some cases, a search word may be wider than the search word buffer even in a NAND architecture.

Figure 7A:
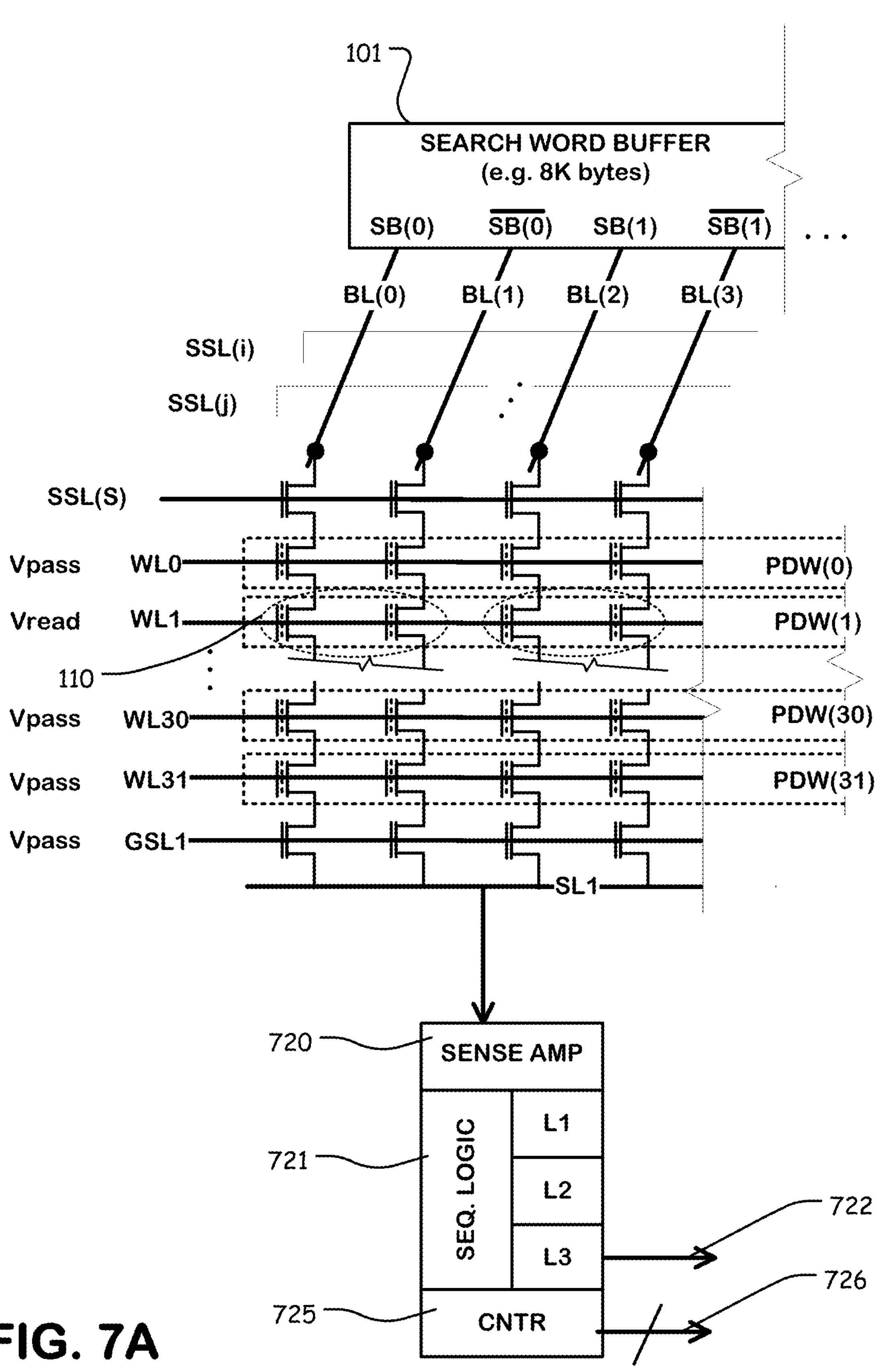
FIG. 7A is a simplified diagram of a TCAM configured, NAND architecture memory, with logic supporting multiple access cycles using partial search words for long search words.
Figure 7B:
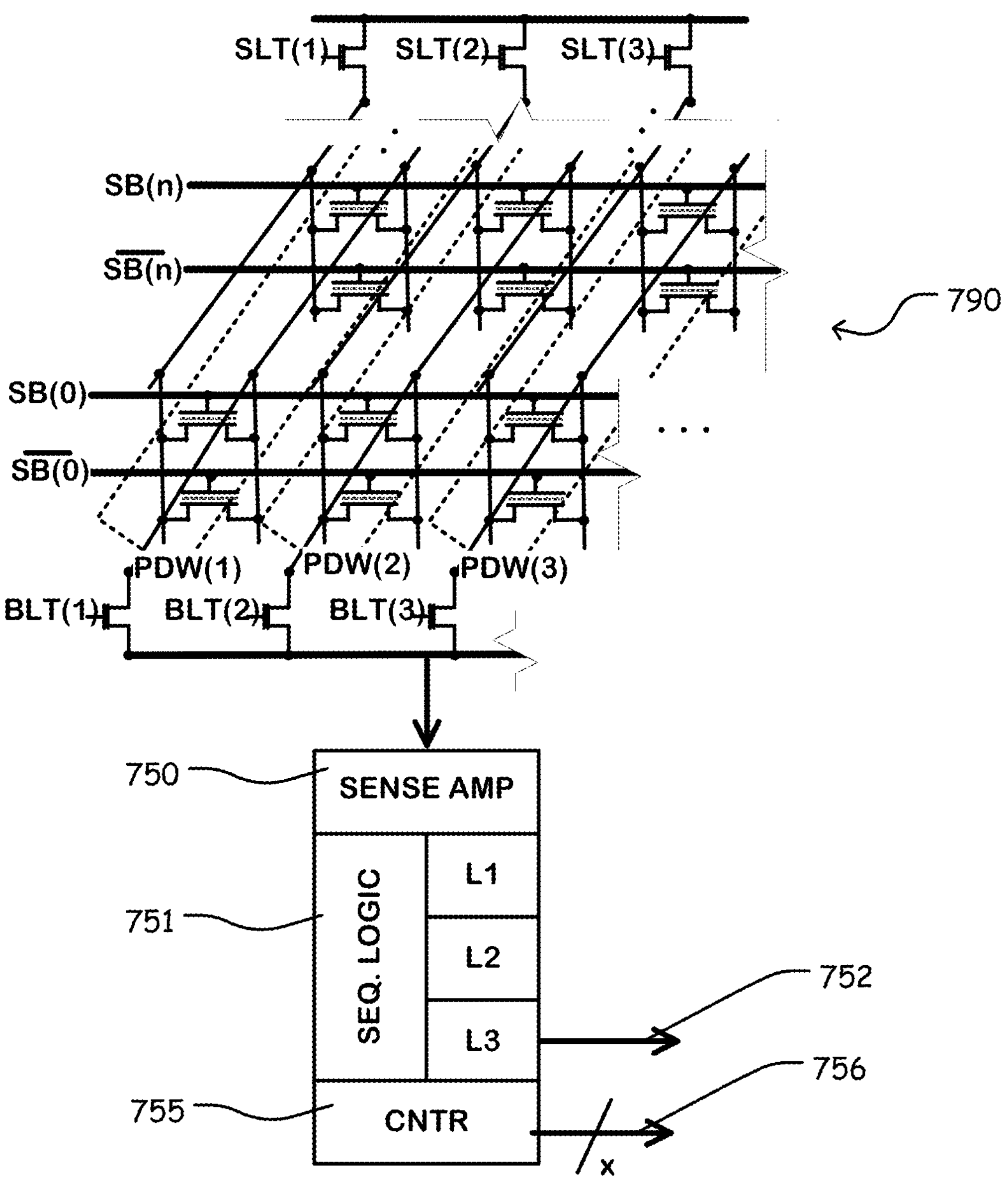
FIG. 7B is a simplified diagram of a TCAM configured, AND architecture memory, with logic supporting multiple access cycles using partial search words for long search words.

Alternatively, for a search word wider than a search word buffer, a TCAM access can be executed in a pipelined fashion, dividing the search word in the multiple partial search words, placing stored data words for matching in the array as a plurality of partial stored data words, and executing the TCAM access in sequence. FIGS. 7A and 7B illustrate embodiments supporting a partial word searching pipeline, utilizing TCAM accesses using partial search word searching. In FIGS. 7A and 7B, examples of logic to accumulate similarity match results of a plurality of partial search words of a search word to indicate similarity of the search word is shown.

In FIG. 7A, a 3D NAND block is coupled to a search word buffer 101 storing search word bits SB(0),/SB(0) to SB(n),/SB(n), where the number of search word bits corresponds to the number of bit lines supported by the search word buffer 101 for the block. The stored words are divided into partial data words PDW(1), PDW(2), PDW(3), . . . , which are stored in respective levels of the array is illustrated in FIG. 7A.

In operation, a partial search words are loaded in the search word buffer and matched with corresponding partial stored data words coupled to word lines of the NAND block in sequence. In each access cycle in the sequence, the sense amplifier 720 generates a signal based on the sum of currents as discussed above. Sequence logic 721, a cache or a set of caches such as the caches L1, L2, L3 shown in the diagram, are used to accumulate the match results across the partial search words of the search word until a final partial search word or until the sequence is otherwise ended, to provide an output on line 722, which can be provided to a state machine in a controller or other logic for processing. This process can operate on exact match mode, in which any sensed current level during a partial search word match can indicate a mismatch, or in similarity match mode in which sense current below a threshold as discussed above can indicate a similarity mismatch.

In some embodiments, every NAND block, or every combination of NAND blocks which share a sense amplifier can have its own sequence logic 721 and set of caches L1, L2, L3.

A pipeline TCAM match operation can involve dividing each search word into several search groups, where each search group corresponds with a part of the search word, referred to as a partial search word. Also, the stored word stored in memory are arranged in parts, so that partial data words are arranged for access in one access cycle by a corresponding partial search words. The algorithm can be efficient if all of the partial search words of a search word are used for access to stored partial words in the same block. One partial search word can include several search bits, each comprising true and complement, or ternary, states applied to a bit line pair in the example of FIG. 7A. Thus, a time-domain execution procedure using near-sense amplifier logic to realize TCAM, with flexible numbers of search bits.

According to one logic sequence, at the beginning of an operation, cache L2 and cache L3 can be initially set to a “1” value. After completion of a complete search word in multiple partial access cycles, the caches L1, L2, L3 can be reset for reuse.

In one example procedure, process includes the following:

1. Enable the word lines and source lines for a first partial search word, and apply a first partial search word on the bit lines of the block.
2. For purpose of illustration of the logic, a result of the first partial search word access is assumed to be a match, such that there is no current sensed. The sense amp 720 outputs a “0” state and stores that “zero” state in cache L1.
3. Cache L2 in this cycle is at the original “1” state.
4. Cache L3 is set to the logic results of NOT(L1) AND L2. In the case of a match as stated in step 2, the results of this logic stored in cache L3 is “1”.
5. Cache L2 is written with the results stored in cache L3.
6. Enable the word lines and source lines for a next partial search word, and apply a second partial search word on the bit lines.
7. A result of the second partial word search access is a mismatch, such that there is current sensed. The sense amp 720 outputs the “1” state in stores that “1” state in cache L1.
8. Cache L2 stores the result “1 from the first access cycle.
9. Cache L3 is set to the logic results of NOT(L1) AND L2. In the case of a mismatch as stated in step 7, the results of this logic stored in cache L3 is “0”.
10. Cache L2 is written with results stored in cache L3. Once cache L2 is set to “0” in this value propagates throughout the sequence until the final partial search word.

Alternatively, the sequence of partial search words for the full search word can be stopped at the state in response to cache L2 equal to “0”.

Thus, the partial search word pipeline continues until a mismatch is detected, at which point cache L2 is set to “0”, and a mismatch for the entire search word is indicated. In the case in which any partial search word results in a mismatch, then the sequence for the full search word can be stopped. Of course, partial search words of any size might be implemented depending on the particular implementation of the memory array. For example, a NAND block might support 256 bit lines per access, corresponding to a 128 ternary bit partial search word. This flow can be executed in an exact match setting, which a mismatch in any partial search word results in an exact match miss for the entire search word. Alternatively, this flow can be executed using a similarity match setting, in which a similarity match miss for any partial search word can result in a similarity match miss for the entire search word.

Also shown in FIG. 7A, a counter 725 can be coupled to the sense amp 720, can provide a counter output on line 726 which can be connected to a state machine in a controller or other logic for processing. In the case of a similarity match system, sense amp 720 can include an analog-to-digital converter for example, which outputs a digital value indicating the number of mismatch bits in the partial search word. The counter 725 can be used to accumulate the number of mismatch bits output by the ADC, or alternatively to accumulate the L3 bit from each cycle, across a sequence of partial search word accesses. The counter 725 reaches the threshold value, then this can indicate a similarity match miss for the full search word. The counter 725 can be used in combination with the sequence logic 721 and caches L1, L2, L3, or can be utilized independently. A given embodiment might include one or more of these logic circuits supporting a partial word searching pipeline.

In FIG. 7B, a 3D AND block 790 is coupled to a search word buffer storing search word bits SB(0),/SB(0) to SB(n),/SB(n), where the number of search word bits corresponds to the number of word lines supported by the word line driver for the block. The stored words are divided into partial data words PDW(1), PDW(2), PDW(3), . . . , which are stored in respective columns of the array is illustrated in FIG. 7B.

In operation, a partial search words are loaded in the search word buffer and matched with corresponding partial data words in sequence. In each access cycle in the sequence, the sense amplifier 750 generates a signal based on the sum of currents as discussed above. Sequence logic 751, a cache or a set of caches such as the cache L1, L2, L3 shown in the diagram, are used to accumulate the match results across the partial search words of the search word until a final partial search word or until the sequence is otherwise ended, to provide an output on line 752, which can be provided to a state machine in a controller or other logic for processing. This process can operate on exact match mode, in which any sensed current level during a partial search word match can indicate a mismatch, or in similarity match mode in which sense current below a threshold as discussed above can indicate a similarity mismatch.

In some embodiments, every AND block, or every combination of AND blocks which share a sense amplifier can have its own sequence logic 751 and set of caches L1, L2, L3.

As a pipeline TCAM match operation can involve dividing each search word into several search groups, where each search group corresponds with a part of the search word, referred to as a partial search word. Also, the stored word stored in memory are arranged in parts, so that partial data words are arranged for access in one access cycle by a corresponding partial search words. The algorithm can be efficient if all of the partial search words of a search word are used for access to stored partial words in the same block. One partial search word can include several search bits, each comprising true and complement, or ternary, states applied a word line pair in the example of FIG. 7B. Thus, a time-domain execution procedure using near-sense amplifier logic to realize TCAM, with flexible numbers of search bits.

According to one logic sequence like that described with reference to FIG. 7A, at the beginning of an operation, cache L2 and cache L3 can be initially set to a "1" value. After completion of a complete search word in multiple partial access cycles, the caches L1, L2, L3 can be reset for reuse.

In one example procedure, process includes the following:

1. Enable the bit lines and source lines for a first partial search word, and apply a first partial search word to the word lines.
2. For purpose of illustration of the logic, a result of the first partial search word access is assumed to be a match, such that there is no current sensed. The sense amp 750 outputs a "0" state and stores that "zero" state in cache L1.
3. Cache L2 in this cycle is at the original "1" state.
4. Cache L3 is set to the logic results of NOT(L1) AND L2. In the case of a match as stated in step 2, the results of this logic stored in cache L3 is "1".
5. Cache L2 is written with the results stored in cache L3.
6. Enable the bit lines and source lines for a next partial search word, and apply a second partial word search to the word lines.
7. A result of the second partial word search access is a mismatch, such that there is current sensed. The sense amp 750 outputs the "1" state in stores that "1" state in cache L1.
8. Cache L2 stores the result "1 from the first access cycle.
9. Cache L3 is set to the logic results of NOT(L1) AND L2. In the case of a mismatch as stated in step 7, the results of this logic stored in cache L3 is "0".
10. Cache L2 is written with results stored in cache L3. Once cache L2 is set to "0" in this value propagates throughout the sequence until the final partial search word. Alternatively, the sequence of partial search words for the full search word can be stopped at the state in response to cache L2 equal to "0".

Thus, the partial search word pipeline continues until a mismatch is detected, at which point cache L2 is set to "0", and a mismatch for the entire search word is indicated. For example referring to the AND architecture embodiment of FIG. 7B, if the entire search word is 8 KB, and the AND block supports eight bits per access cycle, then the full search word can be divided into a K/8 equal to 1000 partial search words. The 1000 partial search words can be utilized in a pipelined fashion. In the case in which any partial search word results in a mismatch, then the sequence for the full search word can be stopped. Of course, partial search words of any size might be implemented depending on the particular implementation of the memory array. For example, a AND block might support 64 word lines per access, corresponding to a 32 ternary bit partial search word. This flow can be executed in an exact match setting, which a mismatch in any partial search word results in an exact match miss for the entire search word. Alternatively, this flow can be executed using a similarity match setting, in which a similarity match miss for any partial search word can result in a similarity match miss for the entire search word.

Also shown in FIG. 7B, a counter 755 can be coupled to the sense amp 750, can provide a counter output on line 756 which can be connected to a state machine in a controller or other logic for processing. In the case of a similarity match system, sense amp 750 can include an analog-to-digital converter for example, which outputs a digital value indicating the number of mismatch bits in the partial search word. The counter 755 can be used to accumulate the number of mismatch bits output by the ADC, or alternatively to accumulate the L3 bit from each cycle, across a sequence of partial search word accesses. The counter 755 reaches the threshold value, then this can indicate a similarity match miss for the full search word. The counter 755 can be used in combination with the sequence logic 751 and caches L1, L2, L3, or can be utilized independently. A given embodiment might include one or more of these logic circuits supporting a partial word searching pipeline.

The stored word subject of the TCAM matching involving full word or partial word searching can be arranged in the memory blocks in a variety of fashions, which can support simultaneous access of the full word or partial word of stored data to support the TCAM access. FIGS. 8A-8C, 9A-9B and 10A-10C illustrate examples of the arrangement of search words in a 3D AND block architecture.

Figure 8A:
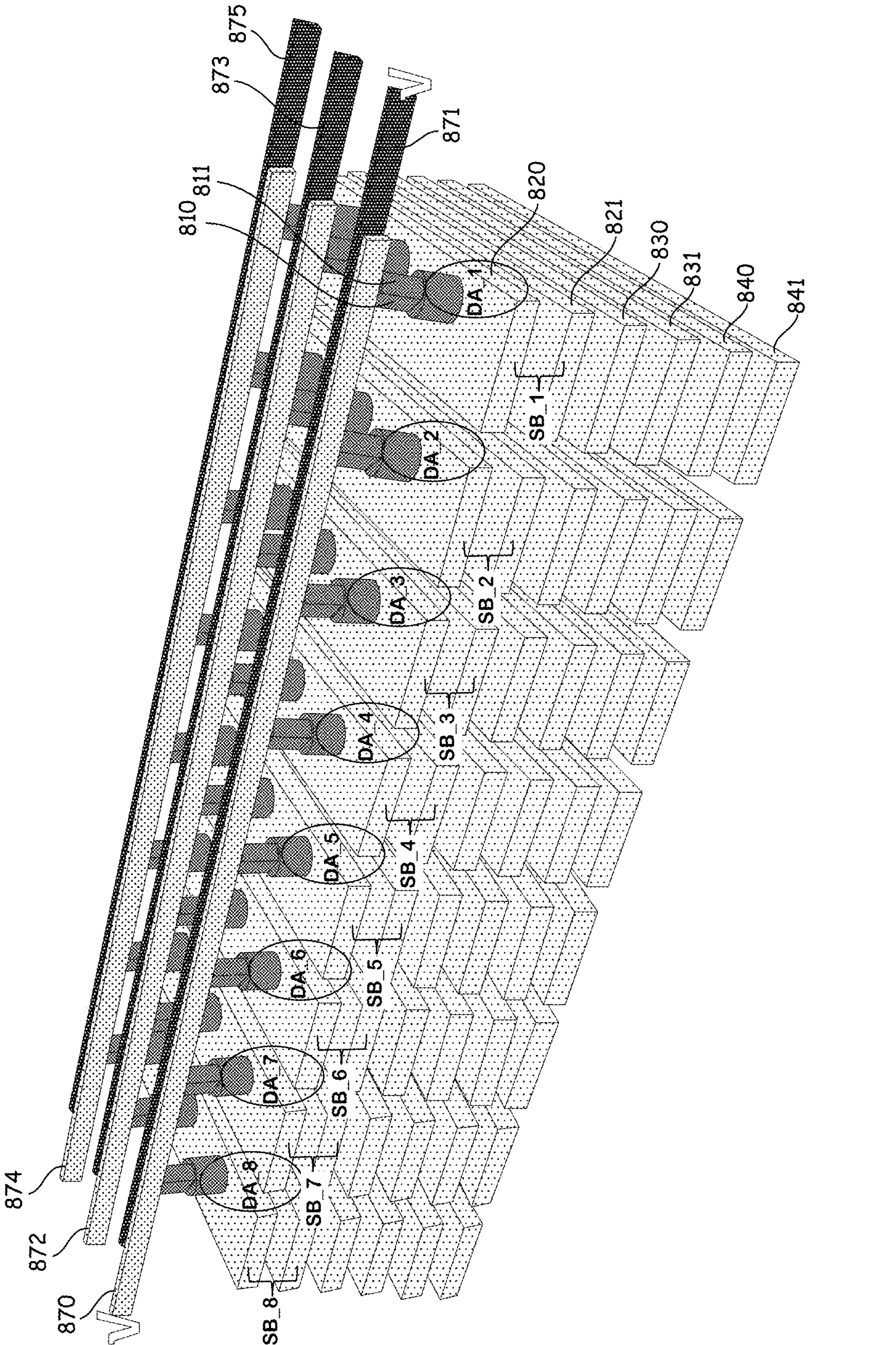
FIGS. 8A, 8B, 8C illustrate a 3D AND architecture structure for sequential data segments stored in one level of TCAM cells with multiple word line pairs in the one level and one bit line and source line pair, in which sequential data segments are selected by traversing the bit line and source line pairs.

FIG. 8A is a 3D illustration of a AND block including three pairs of word line levels, including for one row of stacks, pair 820, 821, pair 830, 831, and pair 840, 841. Overlying the block, the illustration shows bit line/source line pairs including bit line 870 and source line 871, bit line 872 and source line 873 and bit line 874 and source line 875. AND stacks are implemented in memory pillars that penetrate the word line stacks and include vertical source lines (e.g. 810) and vertical bit lines (e.g. 811). Memory cells are disposed at the cross points of the memory pillars and the word lines.

In FIG. 8A, an arrangement of the ternary bits DA_1 to DA_8 of a stored word is illustrated. In this arrangement, the TCAM cells for ternary bits DA_1 to DA_8 include the memory cells at the intersections of the word line pair 820, 821 and the pillars that are connected to the bit line 870 and source line 871. The search bits SB_1 to SB_8 for a TCAM match in this configuration can be applied to the word line pair 820, 821 and corresponding pairs for each of the pillars in the row.

Figure 8B:
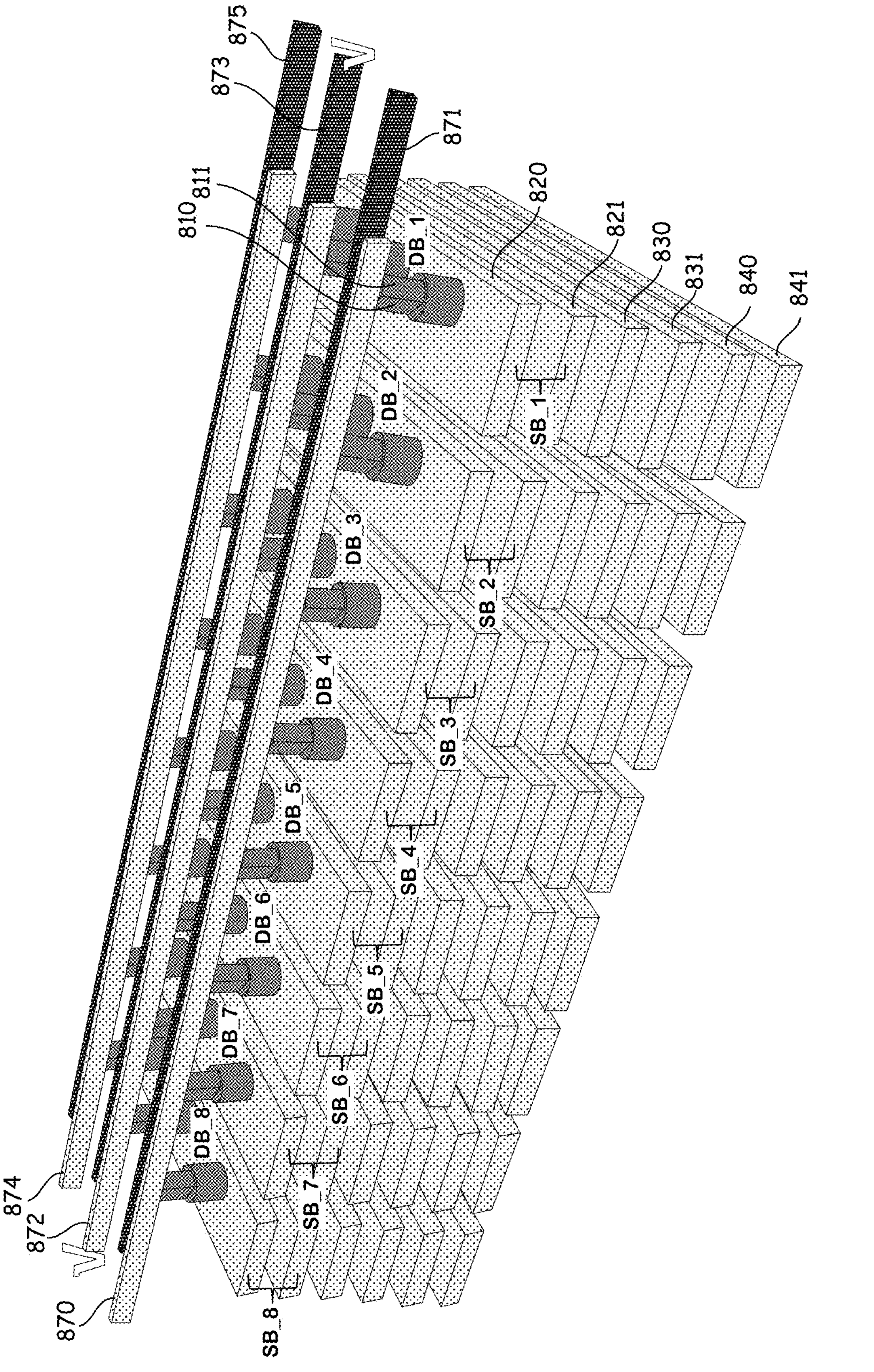

FIG. 8B illustrates the same 3D AND block as FIG. 8A. In FIG. 8B, an arrangement of the TCAM cells for bits DB_1 to DB_8 of a stored word is illustrated. In this arrangement, the bits DB_1 to DB_8 are stored in the memory cells at the intersection of the word line pair 820, 821 and the pillars that are connected to the bit line 872 and source line 873. The search bits SB_1 to SB_8 for a TCAM match in this configuration can be applied to the word line pair 820, 821 and corresponding pairs for each of the pillars in the row.

Figure 8C:
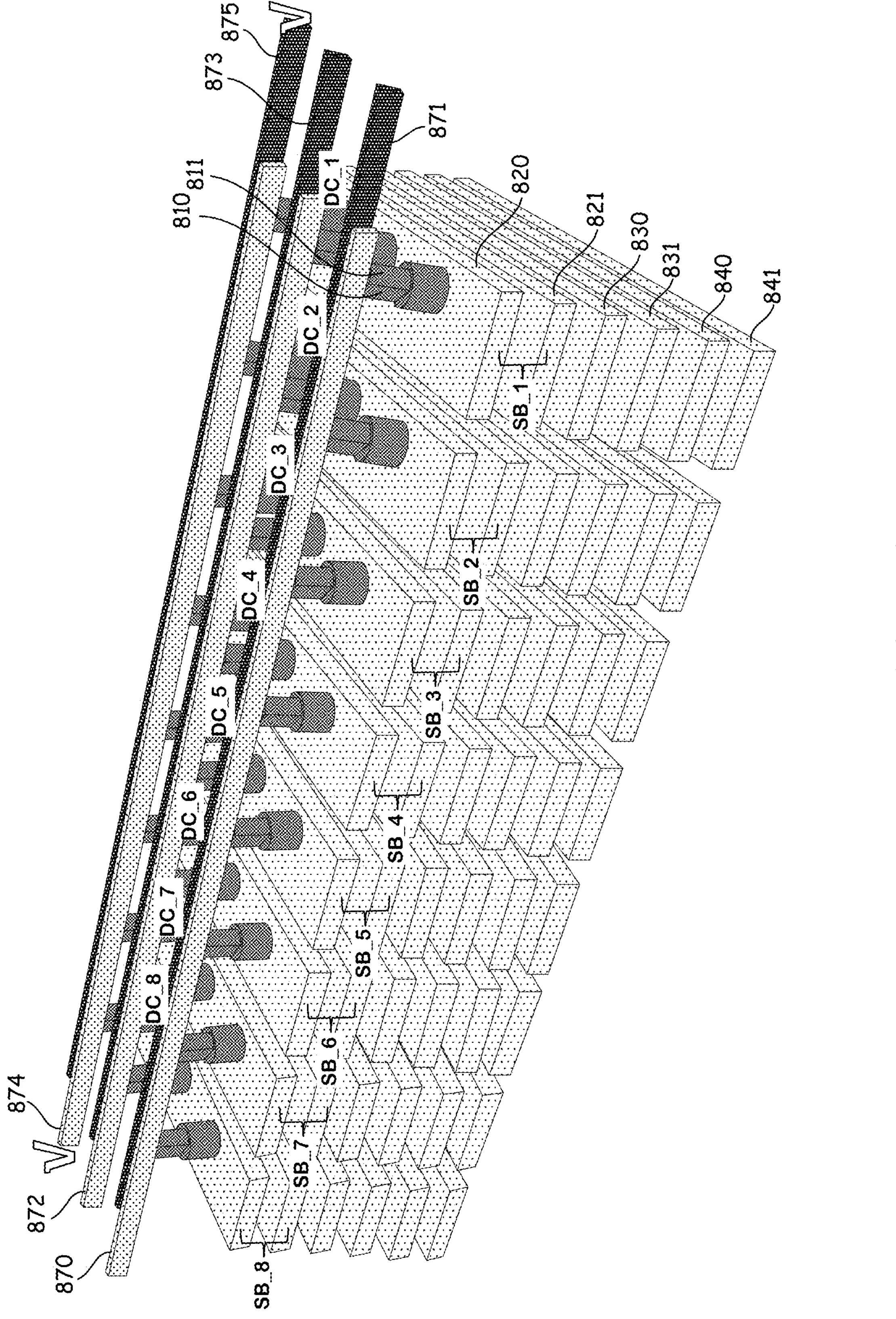

FIG. 8C illustrates the same 3D AND block as FIGS. 8A and 8B. In FIG. 8B, an arrangement of the TCAM cells for bits DC_1 to DC_8 of a stored word is illustrated. In this arrangement, the bits DC_1 to DC_8 are stored in the memory cells at the intersection of the word line pair 820, 821 and the pillars that are connected to the bit line 874 and source line 875. The search bits SB_1 to SB_8 for a TCAM match in this configuration can be applied to the word line pair 820, 821 and corresponding pairs for each of the pillars in the row.

Thus, in a configuration as shown in FIGS. 8A to 8C, a search word can be maintained on the same set of word lines as the access cycles sequence through a plurality of stored words of a large data set. The sequencing can be done by controlling the bit line select transistors and source line select transistors that are used to connect the selected nor stacks to the sense amplifiers for the block.

Figure 9A:
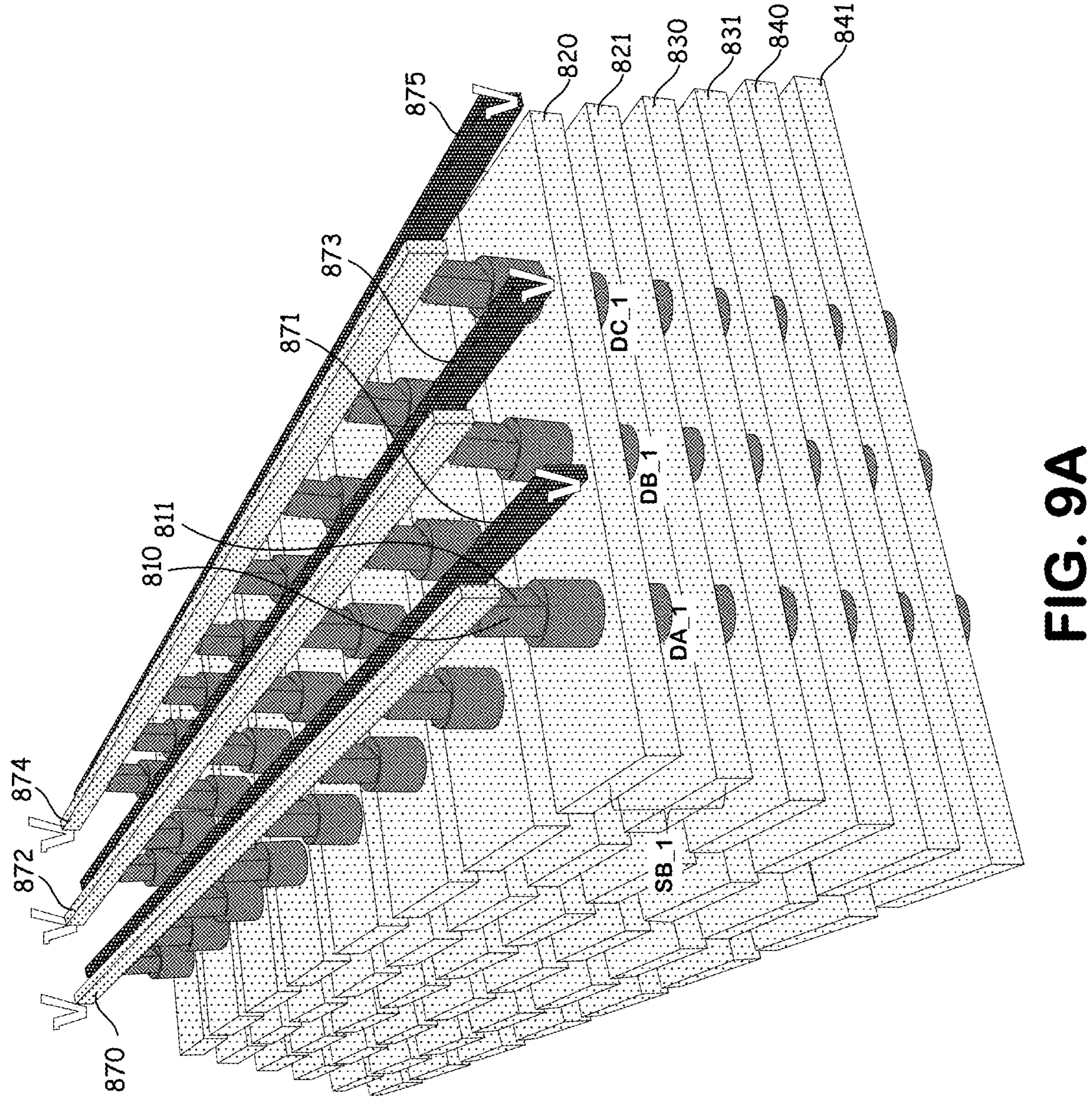
FIGS. 9A-9B illustrate a 3D AND architecture structure for sequential data segments stored in one level of TCAM cells with one word line pair, and multiple bit line/source line pairs per segment, in which sequential data segments are selected by traversing the word line pairs in the one level.
Figure 9B:
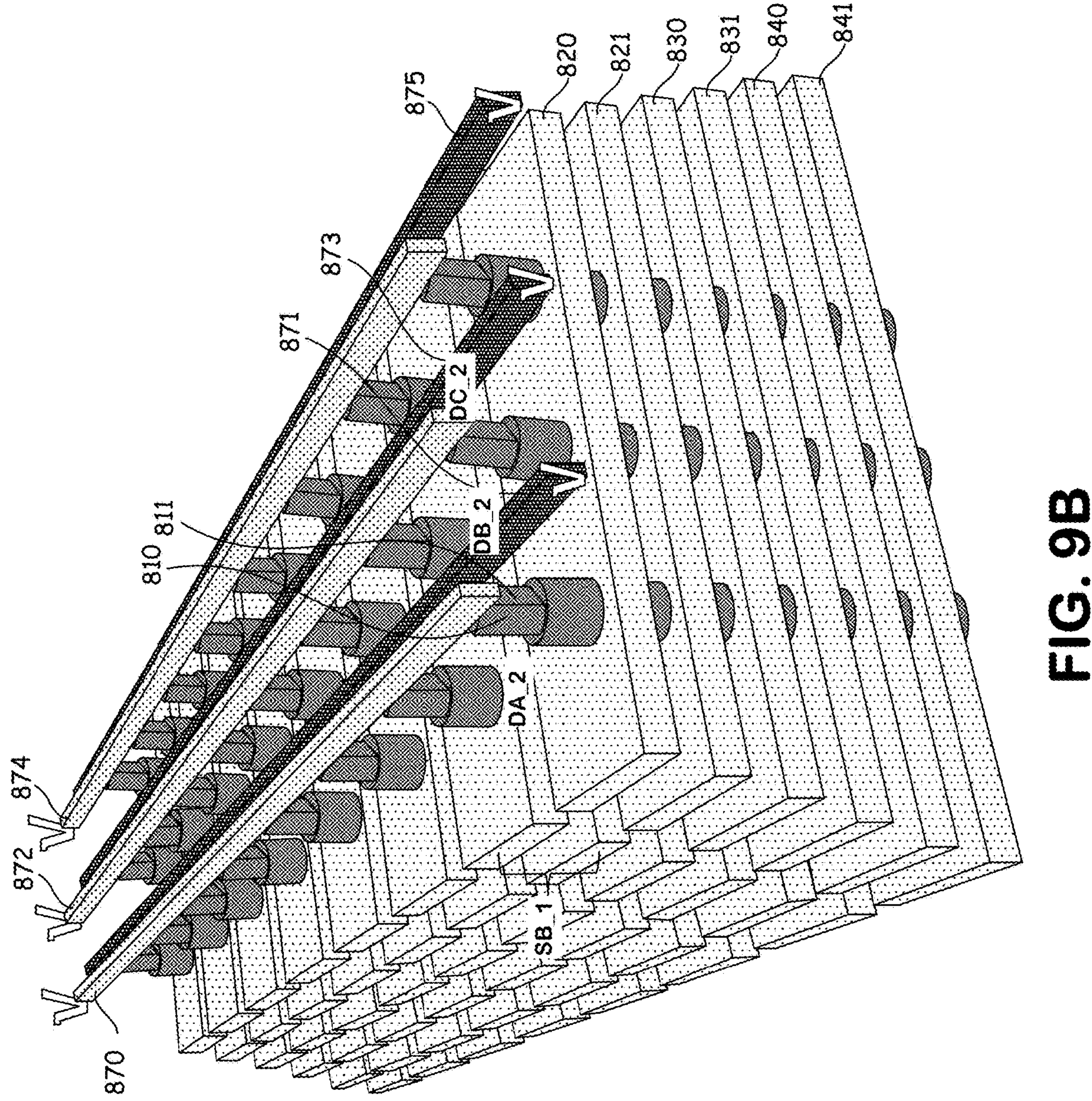

FIGS. 9A and 9B illustrate the same 3D AND block as FIG. 8A, except that it is rotated to show an alternative arrangement of the stored words. In this arrangement, a single search bit, SB_1 in FIG. 9A, is applied on a single word line pair 820, 821 which intersects the pillars in one row that are coupled to the bit line, source line pairs in parallel. In a next access cycle a second search bit, SB_2 in FIG. 9B, is applied on a single word line pair, the next pair over from 820, 821 in this example which intersects the pillars in one row that are coupled to the bit line, source line pairs in parallel. Again, the bit line and source line pairs can be combined at the sense amplifier for the purposes of sensing a summation of the current level generated for a similarity match operation.

Figure 10A:
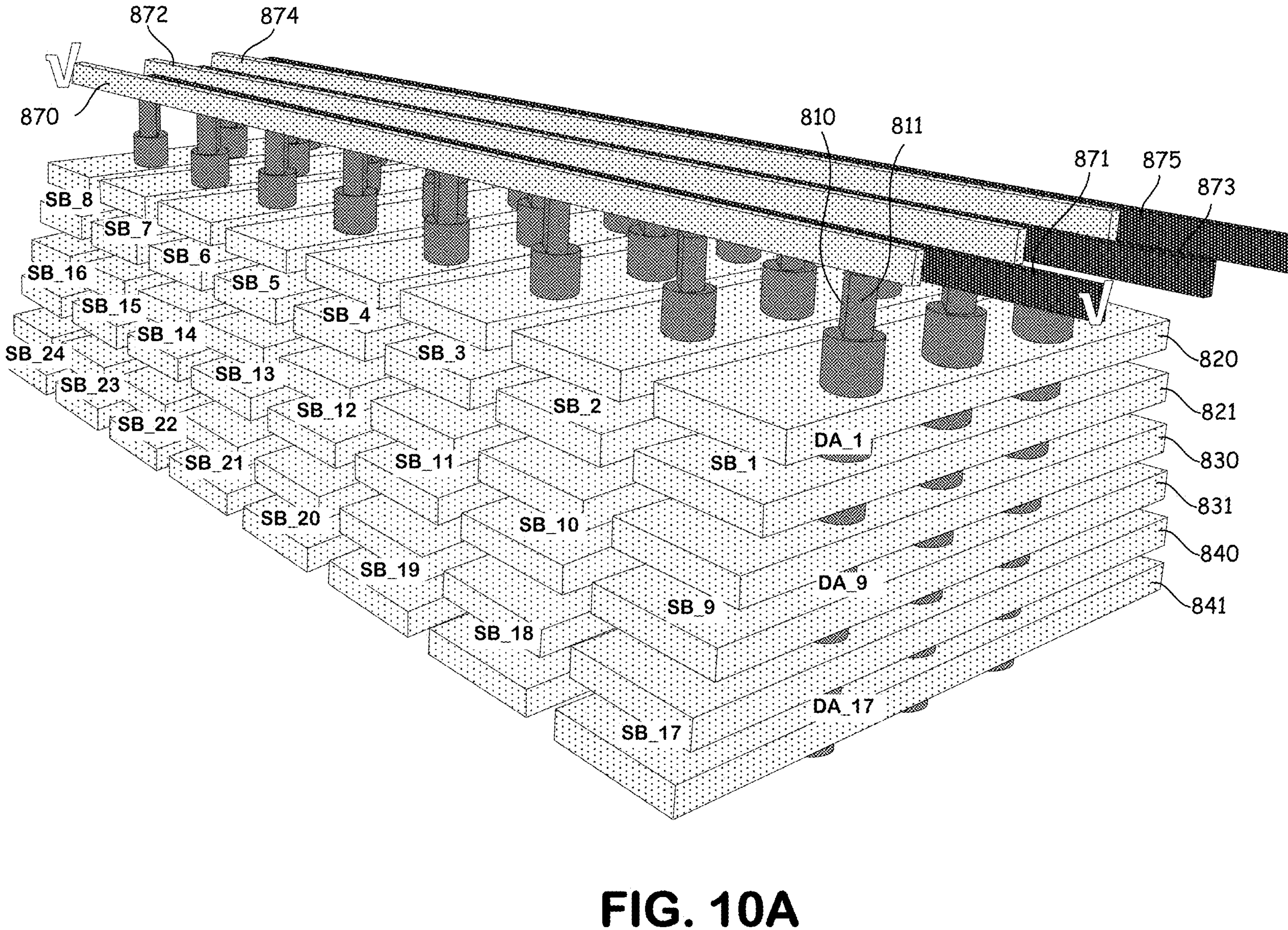
FIGS. 10A, 10B, 10C illustrate a 3D AND architecture structure for sequential data segments stored in multiple levels of TCAM cells with multiple word line pairs in each of the multiple levels and one bit line and source line pair, in which sequential data segments are selected by traversing the bit line and source line pairs.
Figure 10B:
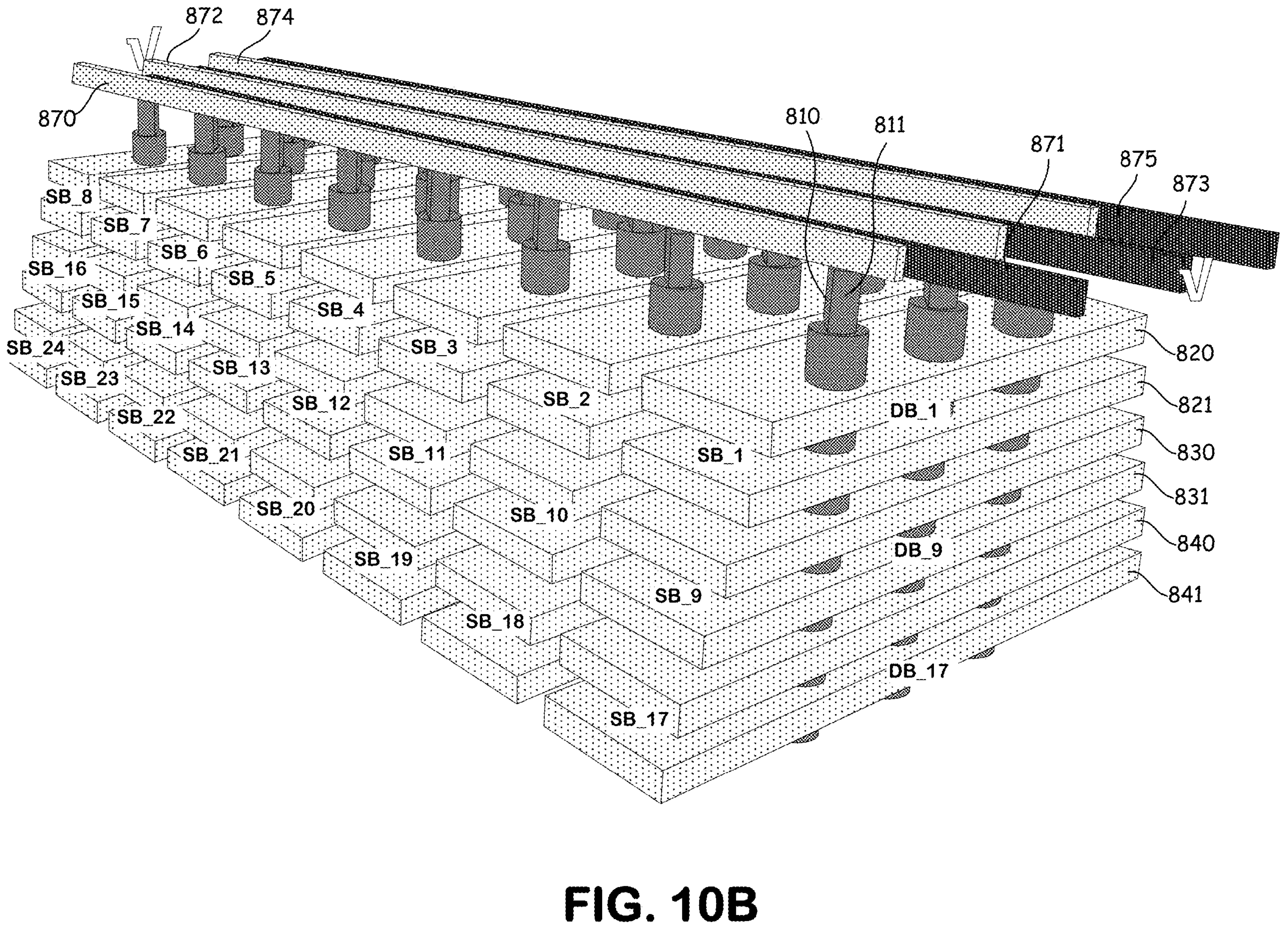

FIGS. 10A, 10B and 10B illustrate the same 3D AND block as FIG. 8A, except that it is rotated to show another alternative arrangement of the stored words. In this alternative arrangement, the row and column arrangements of FIGS. 8A-8C and 9A-9B can be combined to support larger stored words.

In FIG. 10A, a search word is applied such that bits SB_1 to SB_8 are applied to the first and second word line levels (e.g. 820, 821), bits SB_9 to SB_16 are applied to the third and fourth word line levels (e.g. 830, 831) and bits SB_17 to SB_24 are applied to the fifth and sixth word line levels (e.g. 840, 841). The corresponding stored word is stored in the memory cells at the cross points of the word lines and the pillars that are coupled to the first bit line/source line pair 870, 871.

In FIG. 10B, the same search word is applied in the same arrangement. However, the corresponding stored word is stored in the memory cells at the cross point of the word lines in the pillars that are coupled to the second bit line/source line pair 872, 873.

Figure 10C:
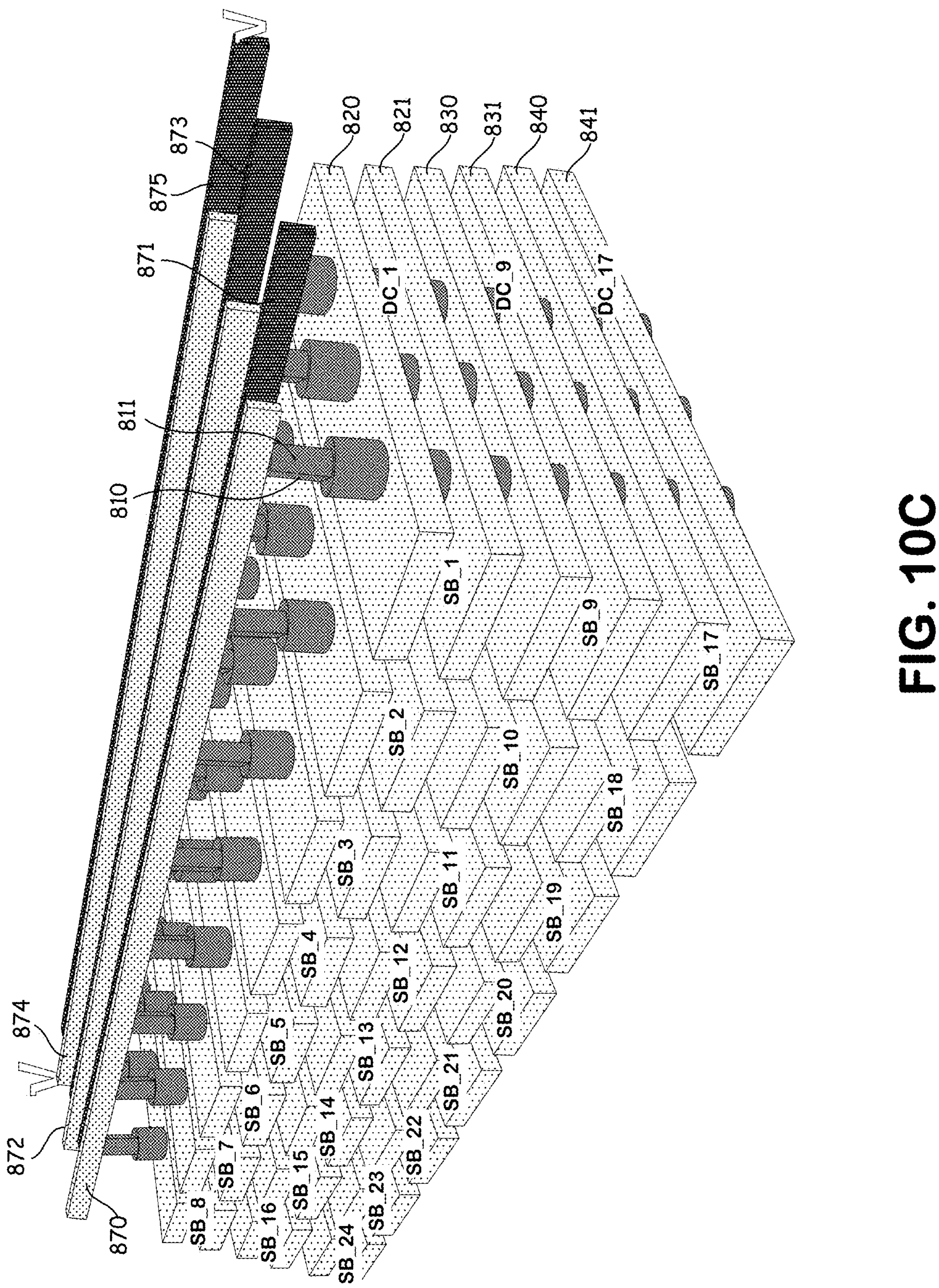

In FIG. 10C, the same search word is applied in the same arrangement. However, the corresponding stored word is stored in the memory cells at the cross point of the word lines in the pillars that are coupled to the third bit line/source line pair 874, 875.

Thus, a wide variety of data arrangements can be utilized in a similarity match circuit as suits the needs of particular implementation, word size and supporting circuits in the device.

Figure 11:
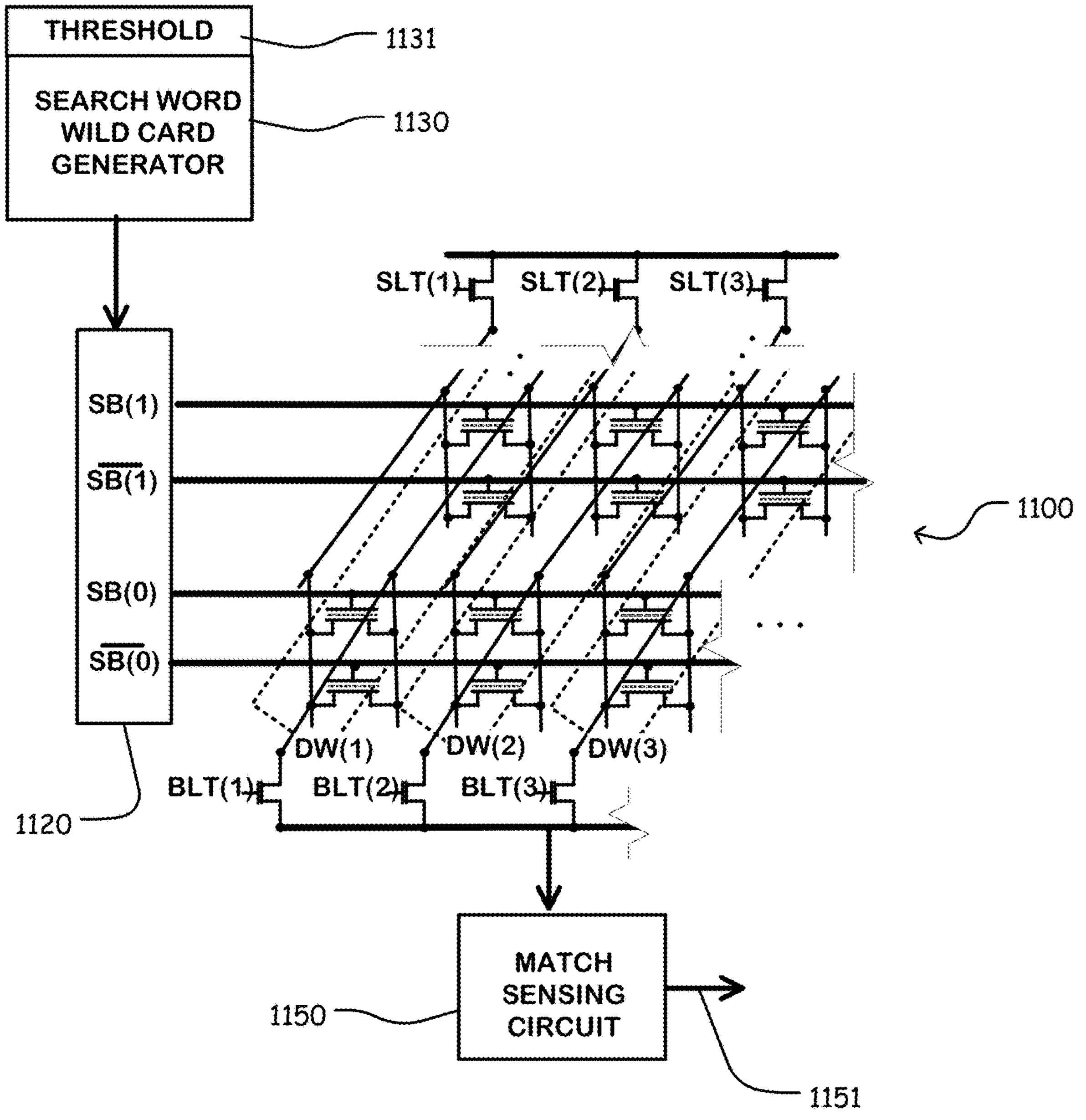
FIG. 11 is a simplified diagram of a TCAM configured memory with logic to apply wildcard bits to an input search word for similarity matching.

FIG. 11 illustrates another embodiment of a nonvolatile TCAM circuit supporting similarity match operations. In FIG. 11, a AND block 1100 like that of FIG. 4 is illustrated. The output of the AND block 1100 is applied to a match sensing circuits 1150, which outputs a match signal on line 1151. In this embodiment, the match sensing circuits 1150 can execute an exact match operation, or a similarity match operation. A search word buffer 1120 is coupled to the word lines of the block 1100. The search word buffer 1120 stores the ternary states of the search bits of the search word. A search word wildcard generator 1130 is coupled to the search word buffer. Wildcard generator can select individual bits as wildcard bits of the search word to set to wildcard state, which is like a don't care "X" state in a bit of a stored data word. The wildcard state results in masking some of the individual bits of the search word for the similarity match. The locations of wildcard bits in the search word can be determined randomly, or set according to a pattern suitable for a particular implementation. The number of selected wildcard bits can be set according to the desired implementation. For example, between 5% and 20% of the search bits of the search word can be set as wildcard bits. In some embodiments, one or both of the number of wildcard bits and the distribution of wildcard bits, set in a given search word is an adjustable parameter set for example by writing a similarity threshold value in a threshold register 1131 on the integrated circuit, where the number of wildcard bits is determinative of a similarity threshold for the match operation. Setting parts of a search word to a wildcard state can result in a TCAM match operation using a "fuzzy search." A stored word which matches the search bits not set as wildcard of the search word, using exact match (no mismatch) or a similarity match (number of mismatches less than a threshold greater than one), can be tagged as similar to the search word and passed to the host system for further processing. Also, "fuzzy" search can be implemented by setting bits of a stored data word to the "don't care" state. In addition, "fuzzy" search can be implemented using a combination of setting parts of a search word to a wildcard state, and parts of a stored data word to a "don't care" stage.

FIG. 11 illustrates a TCAM circuit using a AND architecture memory structure. However, the technology using wildcard bits in input search words for "fuzzy" search, for similarity matching, and for both, can be applied in NAND architecture memory structures, like FIG. 1, or other types of TCAM configured memory structures as suits a particular embodiment.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory, comprising:

a memory array arranged to hold stored words in respective sets of content addressable memory (CAM) cells, each CAM cell configured to store states of a bit of a stored word;

a circuit to apply an input search word to CAM cells in a selected set of CAM cells; and a circuit to generate an output indicating similarity of a stored word in the selected set of CAM cells to the input search word, wherein the output generated by the circuit to generate the output includes a signal indicating similarity when a number of mismatches of bits in the stored word in the selected set of CAM cells to the input search word is below a threshold, the threshold being greater than one, wherein the memory array comprises an array of memory cells, and each CAM cell in the sets of CAM cells including one or more memory cells of the array to store states of a bit of a stored word, and wherein the array of memory cells includes a plurality of bit lines coupled to respective columns of stacks of memory cells in the array, and a plurality of word lines coupled to memory cells in respective rows of stacks of memory cells in the array, and the one or more memory cells in the CAM cells in one of the sets of CAM cells are disposed in one or more levels of one of the respective rows of stacks of memory cells.

2. The memory of claim 1, wherein the array of memory cells includes bit lines coupled to respective columns of memory cells in the array, and word lines coupled to respective rows of memory cells in the array, and the one or more memory cells in the CAM cells in one of the sets of CAM cells are disposed in one of the rows of memory cells.

3. The memory of claim 2, wherein the circuit to select a set of CAM cells applies signals to word lines of the memory array.

4. The memory of claim 2, wherein the one or more memory cells in the CAM cells in one of the sets of CAM cells are disposed in corresponding pairs of one or more columns of memory cells in the array, coupled to respective pairs of one or more bit lines in the bit lines; and wherein the circuit to apply an input search word applies signals to the bit lines.

5. The memory of claim 4, wherein the columns of memory cells are arranged in NAND strings, and the circuit to generate an output indicating similarity combines outputs of a plurality of pairs of one or more columns of memory cells of the CAM cells in the selected set of CAM cells.

6. The memory of claim 1, wherein the one or more memory cells in the CAM cells in one of the sets of CAM cells are disposed in corresponding pairs of one or more levels of memory cells in the array, coupled to respective pairs of one or more word lines in the plurality of word lines; and wherein the circuit to apply an input search word applies signals to the plurality of word lines.

7. The memory of claim 1, wherein the columns of stacks of memory cells are arranged in parallel between corresponding bit lines in the plurality of bit lines and corresponding source lines, and the circuit to generate an output indicating similarity combines outputs of the columns of stacks of memory cells of a plurality of CAM cells in the selected set of CAM cells.

8. The memory of claim 1, wherein the circuit to generate an output indicating similarity includes an analog to digital converter, and the output is a multibit digital signal based on a number of mismatches of bits in the stored word in the selected set of CAM cells to the input search word.

9. The memory of claim 1, including a circuit to replace one or more bits on the input search word with a wildcard state.

10. The memory of claim 1, including a circuit to replace one or more bits on the input search word with a "wildcard" state, and wherein the circuit to generate an output indicating similarity generates a signal indicating similarity when a mismatch of at least one bit in the stored word in the selected set of CAM cells to the input search word is detected.

11. The memory of claim 1, including a register to store a parameter setting a similarity threshold for the circuit to generate an output indicating similarity.

12. The memory of claim 1, wherein the input search word includes a plurality of partial search words, and the circuit to generate an output indicating similarity includes logic to accumulate similarity match results of a plurality of partial search words to indicate similarity of the input search word.

13. The memory of claim 1, wherein the array of memory cells comprises an array of vertical NAND strings.

14. A memory, comprising:

an array of memory cells arranged to hold stored words in respective sets of content addressable memory (CAM) cells, each CAM cell in the sets of CAM cells including one or more memory cells of the array configured to store states of a bit of a stored word;

a circuit to apply an input search word to CAM cells in a selected set of CAM cells; and a circuit to generate an output indicating similarity of a stored word in the selected set of CAM cells to the input search word, wherein the output generated by the circuit to generate the output includes a signal indicating similarity when a number of mismatches of bits in the stored word in the selected set of CAM cells to the input search word is below a threshold, the threshold being greater than one, and wherein the array of memory cells comprises an array of stacks of AND memory cells.

15. The memory of claim 14, including a circuit to replace one or more bits on the input search word with a "wildcard" state, and wherein the circuit to generate an output indicating similarity generates a signal indicating similarity when a mismatch of at least one bit in the stored word in the selected set of cells to the input search word is detected.

16. The memory of claim 14, wherein the input search word includes a plurality of partial search words, and the circuit to generate an output indicating-indicate similarity includes logic to accumulate similarity match results of a plurality of partial search words to indicate similarity of the input search word.

17. A memory, comprising:

a memory array arranged to hold stored words in respective sets of content addressable memory (CAM) cells, each CAM cell configured to store states of a bit of a stored word;

a circuit to apply an input search word to CAM cells in a selected set of CAM cells; and a circuit to generate an output indicating similarity of a stored word in the selected set of CAM cells to the input search word, wherein the output generated by the circuit to generate the output includes a signal indicating similarity when a number of mismatches of bits in the stored word in the selected set of CAM cells to the input search word is below a threshold, the threshold being greater than one, and wherein the input search word includes a plurality of partial search words, and the circuit to generate an output indicating similarity includes logic to accumulate similarity match results of a plurality of partial search words to indicate similarity of the input search word.

* * * * *